United States Patent
Hwang et al.

(10) Patent No.: US 12,446,221 B2
(45) Date of Patent: Oct. 14, 2025

(54) VERTICAL NON-VOLATILE MEMORY DEVICES

(71) Applicant: Samsung Electronics Co., Ltd., Suwon-si (KR)

(72) Inventors: Doohee Hwang, Uiwang-si (KR); Taehun Kim, Gwacheon-si (KR); Minkyung Bae, Hwaseong-si (KR); Nayeong Yun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 545 days.

(21) Appl. No.: 17/849,783

(22) Filed: Jun. 27, 2022

(65) Prior Publication Data

US 2023/0095469 A1    Mar. 30, 2023

(30) Foreign Application Priority Data

Sep. 30, 2021    (KR) .......................... 10-2021-0130288

(51) Int. Cl.
  *H10B 43/27*    (2023.01)
  *H10B 41/27*    (2023.01)

(52) U.S. Cl.
  CPC ............. *H10B 43/27* (2023.02); *H10B 41/27* (2023.02)

(58) Field of Classification Search
  CPC ........ H10B 43/27; H10B 41/27; H10B 43/30; H01L 29/66833; H01L 29/792

(Continued)

(56) References Cited

U.S. PATENT DOCUMENTS

| 7,928,493 B2 | 4/2011 | Cho et al. |
| 9,406,811 B2 | 8/2016 | Higuchi et al. |

(Continued)

FOREIGN PATENT DOCUMENTS

| KR | 10-2008-0032841 A | 4/2008 |
| KR | 100934532 B1 | 12/2009 |

(Continued)

OTHER PUBLICATIONS

3. Ramesh et al. Micromachines 2021, 12, 1084. https://doi.org/10.3390/mi12091084—Published Sep. 8, 2021 (Year: 2021).*

(Continued)

*Primary Examiner* — Christine S. Kim
*Assistant Examiner* — Nathalie R Fayette
(74) *Attorney, Agent, or Firm* — Wolf, Greenfield & Sacks, P.C.

(57) ABSTRACT

A vertical non-volatile memory device includes: a memory stack structure including gate lines and interlayer insulating layers and a channel hole extending in a stacking direction; a channel layer in the channel hole and extending in the stacking direction; and an information storage structure including a composite blocking insulating layer, a charge storage layer, and a tunneling insulating layer sequentially arranged in a horizontal direction from the gate lines to the channel layer, wherein the composite blocking insulating layer includes a metal oxide having a higher dielectric constant than silicon oxide, and the composite blocking insulating layer includes a first blocking insulating layer on sides of the gate lines and a second blocking insulating layer that is between the first blocking insulating layer and the charge storage layer and has a lower oxidation density than the first blocking insulating layer.

19 Claims, 27 Drawing Sheets

(58) Field of Classification Search
USPC .......................................................... 257/314
See application file for complete search history.

(56) References Cited

U.S. PATENT DOCUMENTS

| | | | |
|---|---|---|---|
| 9,960,046 | B2 | 5/2018 | Kim et al. |
| 9,997,530 | B2 | 6/2018 | Yon et al. |
| 10,276,583 | B2 * | 4/2019 | Sharangpani et al. ........................ H01L 27/11563 |
| 10,381,450 | B1 * | 8/2019 | Yada et al. ........ H01L 29/42344 |
| 10,529,620 | B2 * | 1/2020 | Sharangpani et al. . H10B 41/41 |
| 11,056,571 | B2 * | 7/2021 | Sharma et al. ...... H10D 64/037 |
| 2009/0035904 | A1 | 2/2009 | Bhattacharyya |
| 2010/0006923 | A1 | 1/2010 | Fujitsuka et al. |
| 2018/0033646 | A1 | 2/2018 | Sharangpani et al. |

FOREIGN PATENT DOCUMENTS

| | | |
|---|---|---|
| KR | 101027350 B1 | 4/2011 |
| KR | 20160000047 A | 1/2016 |

OTHER PUBLICATIONS

Kita et al. "Origin of electric dipoles formed at high-k/SiO2 interface" Appl. Phys. Lett. 94:132902 (2009).

* cited by examiner

VERTICAL NON-VOLATILE MEMORY DEVICES

CROSS-REFERENCE TO RELATED APPLICATION

This application is based on and claims priority under 35 U.S.C. § 119 to Korean Patent Application No. 10-2021-0130288, filed on Sep. 30, 2021, in the Korean Intellectual Property Office, the disclosure of which is incorporated by reference herein in its entirety.

BACKGROUND

The inventive concept relates to a memory device, and more particularly, to a vertical non-volatile memory device.

The degree of integration of a memory device (e.g., a non-volatile memory device) may be improved by stacking cell transistors in a vertical direction. For example, for a NAND flash memory in which each memory cell is made up of a transistor, the degree of integration may be improved by vertically stacking memory cells.

SUMMARY

The inventive concept provides a vertical non-volatile memory device including memory cells with improved characteristics.

According to example embodiments of the inventive concept, an integrated circuit device (e.g., a vertical non-volatile memory device) includes: a memory stack structure including gate lines and interlayer insulating layers alternately stacked on top of one another in a stacking direction and a channel hole that is formed in the gate lines and the interlayer insulating layers to extend in the stacking direction; a channel layer located in the channel hole of the memory stack structure and extending in the stacking direction; and an information storage structure including a composite blocking insulating layer, a charge storage layer, and a tunneling insulating layer sequentially arranged in a horizontal direction from the gate lines to the channel layer, wherein the composite blocking insulating layer includes a metal oxide having a higher dielectric constant than silicon oxide, and the composite blocking insulating layer includes a first blocking insulating layer arranged on one side of each of the gate lines and a second blocking insulating layer arranged between the first blocking insulating layer and the charge storage layer and having a lower oxidation density than the first blocking insulating layer.

According to example embodiments of the inventive concept, a vertical non-volatile memory device includes: a memory stack structure including gate lines and interlayer insulating layers alternately stacked on top of one another in a stacking direction and a channel hole formed in the gate lines and the interlayer insulating layers to extend in the stacking direction; a channel layer located in the channel hole of the memory stack structure and extending in the stacking direction; and an information storage structure including a composite blocking insulating layer, a charge storage layer, and a tunneling insulating layer sequentially arranged in a horizontal direction from the gate lines to the channel layer.

The composite blocking insulating layer includes a metal oxide having a higher dielectric constant than silicon oxide, and the composite blocking insulating layer includes a first blocking insulating layer arranged on one side of each of the gate lines and a second blocking insulating layer arranged between the first blocking insulating layer and the charge storage layer and having a lower oxidation density than the first blocking insulating layer. In some embodiments, the second blocking insulating layer may be between the first blocking insulating layer and the charge storage layer.

According to example embodiments of the inventive concept, a memory device (e.g., a vertical non-volatile memory device) includes: a memory stack structure including gate lines and interlayer insulating layers alternately stacked on top of one another and a channel hole formed in the gate lines and the interlayer insulating layers to extend in a stacking direction (e.g., a vertical direction); a channel layer located in the channel hole of the memory stack structure and extending in the stacking direction; and an information storage structure including a composite blocking insulating layer, a charge storage layer, and a tunneling insulating layer sequentially arranged in a horizontal direction from the gate lines to the channel layer. The information storage structure may extend between the gate lines and the channel layer.

The composite blocking insulating layer includes first and second blocking insulating layers that are each formed of a metal oxide having a higher dielectric constant than silicon oxide. The first blocking insulating layer is positioned to surround the gate lines so that portions of the first blocking insulating layer surrounding the gate lines face each other between the gate lines in the stacking direction, and the second blocking insulating layer includes a continuous layer that is formed in the channel hole between the first blocking insulating layer and the charge storage layer to extend in the stacking direction. The second blocking insulating layer has a lower oxidation density than the first blocking insulating layer.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1:
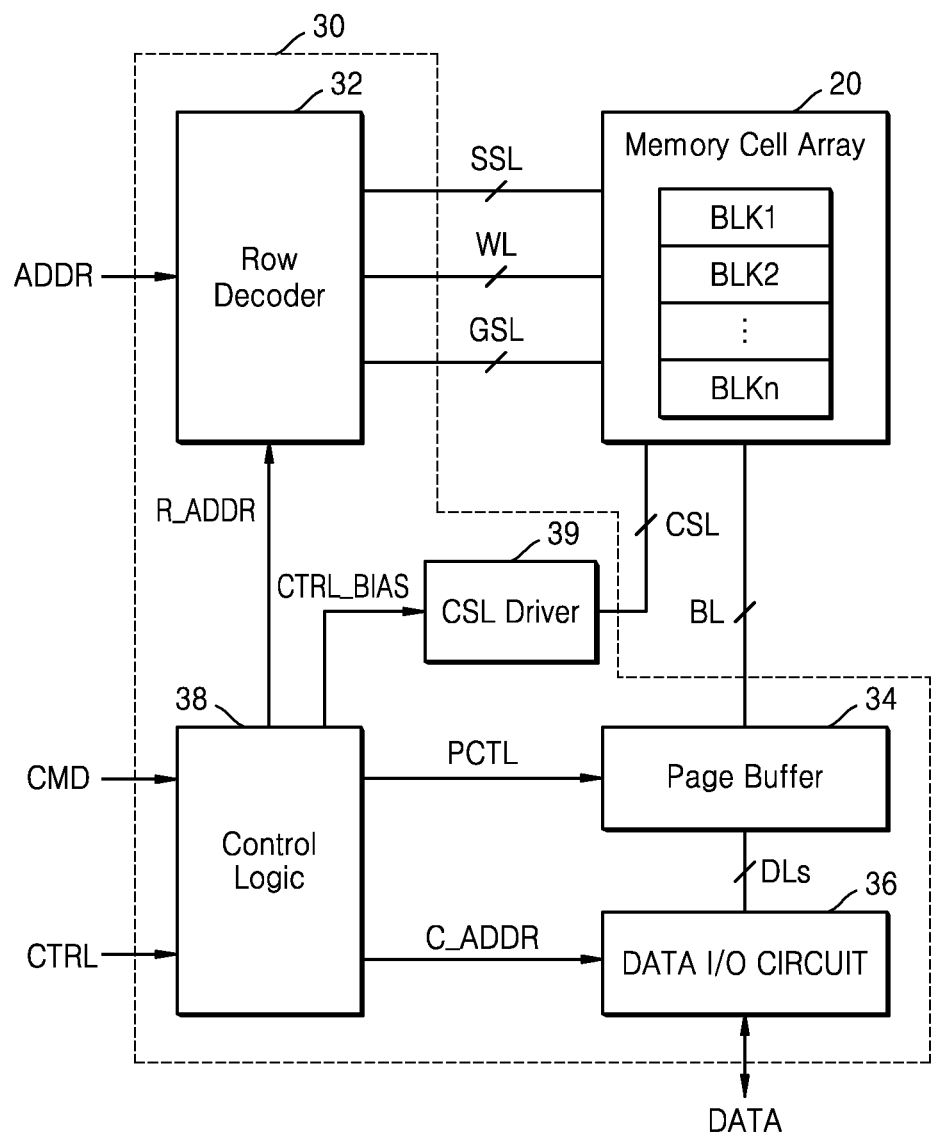
FIG. 1 is a block diagram of a vertical non-volatile memory device according to an embodiment of the inventive concept.

Hereinafter, example embodiments of the inventive concept will be described in detail with reference to the accompanying drawings. Like reference numerals denote like elements in the figures, and detailed descriptions thereof will be omitted herein.

FIG. 1 is a block diagram of a vertical non-volatile memory device 10 according to an embodiment of the inventive concept.

In detail, the vertical non-volatile memory device 10 has the capability to retain stored data even when no power is supplied thereto. The vertical non-volatile memory device 10 may be a vertical NAND flash memory device.

The vertical non-volatile memory device 10 may include a memory cell array 20 and a peripheral circuit 30. The memory cell array 20 includes a plurality of memory cell blocks BLK1 through BLKn (n being a positive integer). Each of the memory cell blocks BLK1 through BLKn may include a plurality of memory cells. The memory cell blocks BLK1 through BLKn may be connected to the peripheral circuit 30 via bit lines BL, word lines WL, at least one string selection line SSL, and at least one ground selection line GSL.

The peripheral circuit 30 may include a row decoder 32, a page buffer 34, a data input/output (I/O) circuit 36, a control logic 38, and a common source line (CSL) driver 39. Although not shown in FIG. 1, the peripheral circuit 30 may include various circuits such as a voltage generation circuit for generating various voltages necessary for an operation of the vertical non-volatile memory device 10, an error correction circuit for correcting errors in data that is read from the memory cell array 20, an I/O interface, etc.

The memory cell array 20 may be connected to the page buffer 34 through the bit lines BL. The memory cell array 20 may be connected to the row decoder 32 through the word lines WL, the string selection line SSL, and the ground selection line GSL. In the memory cell array 20, the memory cells included in each of the memory cell blocks BLK1 through BLKn may be flash memory cells. The memory cell array 20 may include a three-dimensional (3D) memory cell array. The 3D memory cell array may include a plurality of NAND strings. Each of the NAND strings may include a plurality of memory cells connected to vertically stacked word lines WL.

The peripheral circuit 30 may receive an address ADDR, a command CMD, and a control signal CTRL from the outside of the vertical non-volatile memory device 10, and transmit or receive data DATA to or from a device outside the vertical non-volatile memory device 10.

The row decoder 32 may select at least one of the memory cell blocks BLK1 through BLKn in response to the address ADDR from the outside, and select a word line WL, a string selection line SSL, and a ground selection line GSL corresponding to the selected memory cell block. The row decoder 32 may transmit a voltage for performing a memory operation to the word line WL of the selected memory cell block.

The page buffer 34 may be connected to the memory cell array 20 via the bit lines BL. The page buffer 34 may operate as a write driver during a program operation to apply a voltage according to data DATA to be stored in the memory cell array 20 to the bit lines BL, and operate as a sense amplifier during a read operation to sense the data DATA stored in the memory cell array 20. The page buffer 34 may operate according to a control signal PCTL provided from the control logic 38.

The data I/O circuit 36 may be connected to the page buffer 34 through a plurality of data lines DLs. During a program operation, the data I/O circuit 36 may receive data DATA from a memory controller (not shown) and provide program data DATA to the page buffer 34 based on a column address C_ADDR provided from the control logic 38. During a read operation, the data I/O circuit 36 may provide read data DATA stored in the page buffer 34 to the memory controller, based on the column address C_ADDR provided from the control logic 38.

The data I/O circuit 36 may transmit an input address or instruction to the control logic 38 or the row decoder 32. The peripheral circuit 30 may further include an electrostatic discharge (ESD) circuit and a pull-up/pull-down driver.

The control logic 38 may receive a command CMD and a control signal CTRL from the memory controller. The control logic 38 may provide a row address R ADDR to the row decoder 32 and a column address C_ADDR to the data I/O circuit 36. The control logic 38 may generate various internal control signals used in the vertical non-volatile memory device 10 in response to the control signal CTRL. For example, the control logic 38 may adjust voltage levels provided to the word lines WL and the bit lines BL when performing a memory operation such as a program operation or an erase operation.

The CSL driver 39 may be connected to the memory cell array 20 through a CSL. The CSL driver 39 may apply a common source voltage (e.g., a power supply voltage) or a ground voltage to the common source line CSL based on a control signal CTRL BIAS from the control logic 38. In example embodiments, the CSL driver 39 may be arranged below the memory cell array 20. The CSL driver 39 may be arranged to vertically overlap at least a part of the memory cell array 20.

Figure 2A:
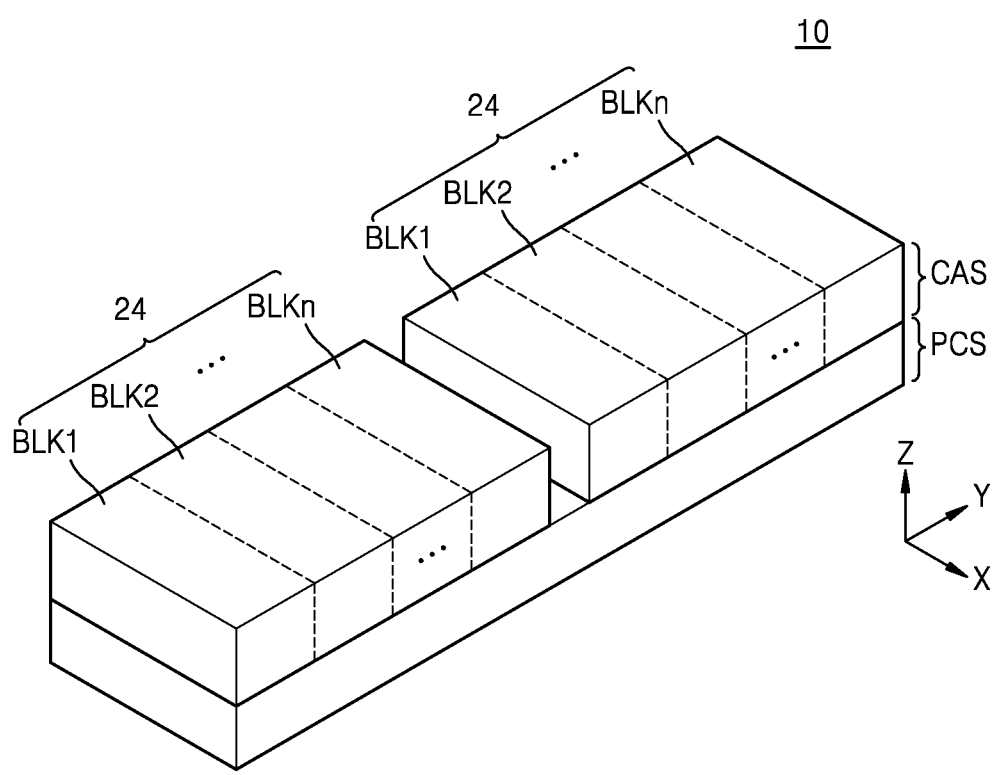
FIGS. 2A and 2B are schematic perspective views of a vertical non-volatile memory device according to an embodiment of the inventive concept.
Figure 2B:
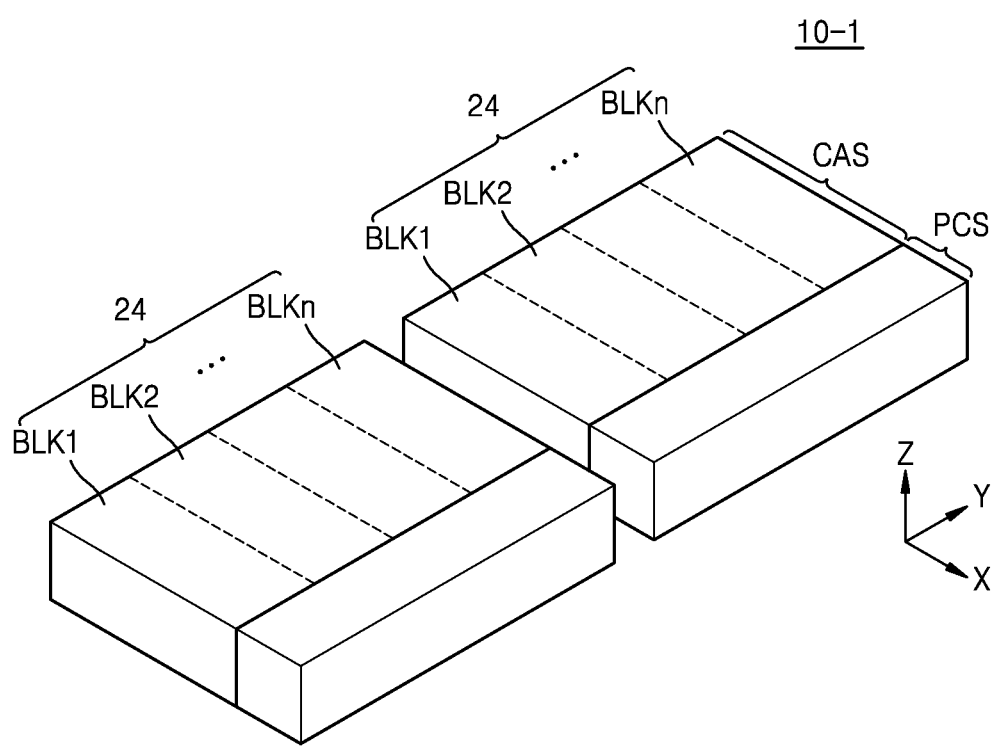

FIGS. 2A and 2B are schematic perspective views of a vertical non-volatile memory device 10 according to an embodiment of the inventive concept.

In detail, the vertical non-volatile memory device 10 of FIG. 2A may include a cell array structure CAS and a peripheral circuit structure PCS overlapping each other in a vertical (Z) direction (a third direction). A horizontal direction (an X or −X direction) may be referred to as a first direction. A horizontal direction (a Y or −Y direction) may be referred to as a second direction.

A vertical non-volatile memory device 10-1 of FIG. 2B may include a cell array structure CAS and a peripheral circuit structure PCS arranged in the horizontal direction (the X direction or first direction). Unlike in FIG. 2A, the peripheral circuit structure PCS of FIG. 2B may be arranged in the horizontal direction (the X direction or first direction).

Referring to FIGS. 2A and 2B, the cell array structure CAS may include the memory cell array 20 of FIG. 1. The peripheral circuit structure PCS may include the peripheral circuit 30 of FIG. 1. The cell array structure CAS of FIGS. 2A and 2B may include a plurality of tiles 24. Each of the tiles 24 may include a plurality of memory cell blocks BLK1 through BLKn (n being a positive integer). The memory cell blocks BLK1 through BLKn may each include a plurality of memory cells arranged in a three-dimensional (3D) grid.

Figure 3:
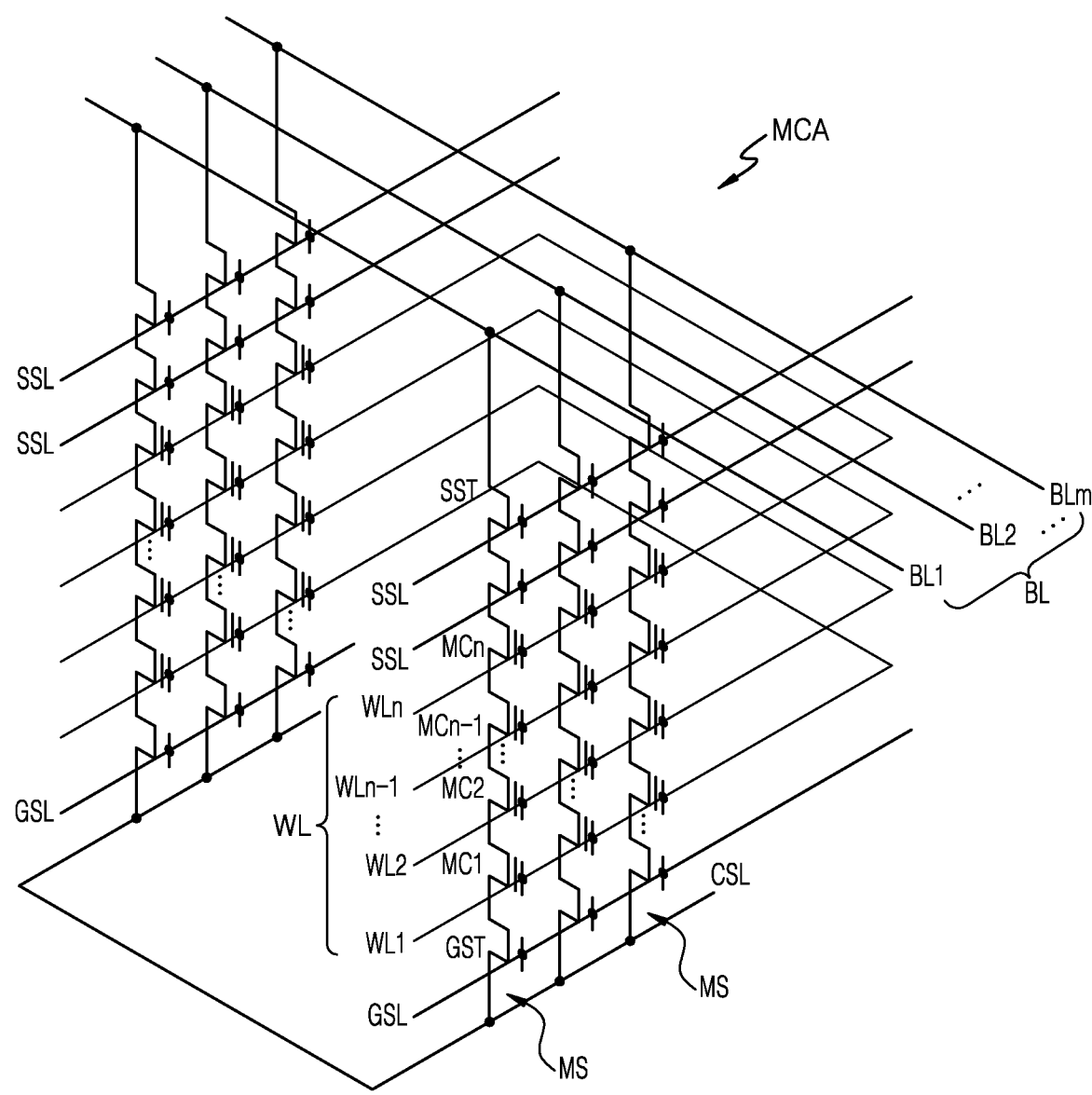
FIG. 3 is an equivalent circuit diagram of a memory cell array MCA of a vertical non-volatile memory device, according to an embodiment of the inventive concept.

FIG. 3 is an equivalent circuit diagram of a memory cell array MCA of a vertical non-volatile memory device, according to an embodiment of the inventive concept.

In detail, FIG. 3 may be an equivalent circuit diagram of a memory cell array MCA of the vertical non-volatile memory device 10 described above, such as a vertical NAND flash memory device. The memory cell blocks BLK1 through BLKn of FIGS. 2A and 2B may each include a memory cell array MCA having a circuit configuration illustrated in FIG. 3.

The memory cell array MCA may include a plurality of memory cell strings MS. The memory cell array MCA may include a plurality of bit lines BL (e.g., BL1 through BLm, m being a positive integer), a plurality of word lines WL (e.g., WL1 through WLn, n being a positive integer), at least one string selection line SSL, at least one ground selection line GSL, and a common source line CSL.

The memory cell strings MS may be arranged between the bit lines BL and the common source lines CSL. FIG. 3 shows an example in which each of the memory cell strings MS include two string selection lines SSL, but embodiments of the inventive concept are not limited thereto. For example, each of the memory cell strings MS may include one string selection line SSL.

Each of the memory cell strings MS may include a string selection transistor SST, a ground selection transistor GST, and a plurality of memory cell transistors MC1 through MCn (n being a positive integer). The memory cell transistors MC1 through MCn may be memory cells.

A drain region of a string selection transistor SST may be connected to a bit line BL, and a source region of a ground selection transistor GST may be connected to the common source line CSL. The common source line CSL may be a region to which source regions of a plurality of ground selection transistors GST are commonly connected.

The string selection transistor SST may be connected to the string selection line SSL, and the ground selection transistor GST may be connected to the ground selection line GSL. The memory cell transistors MC1 through MCn may be respectively connected to the word lines WL (i.e., WL1 through WLn).

Figure 4:
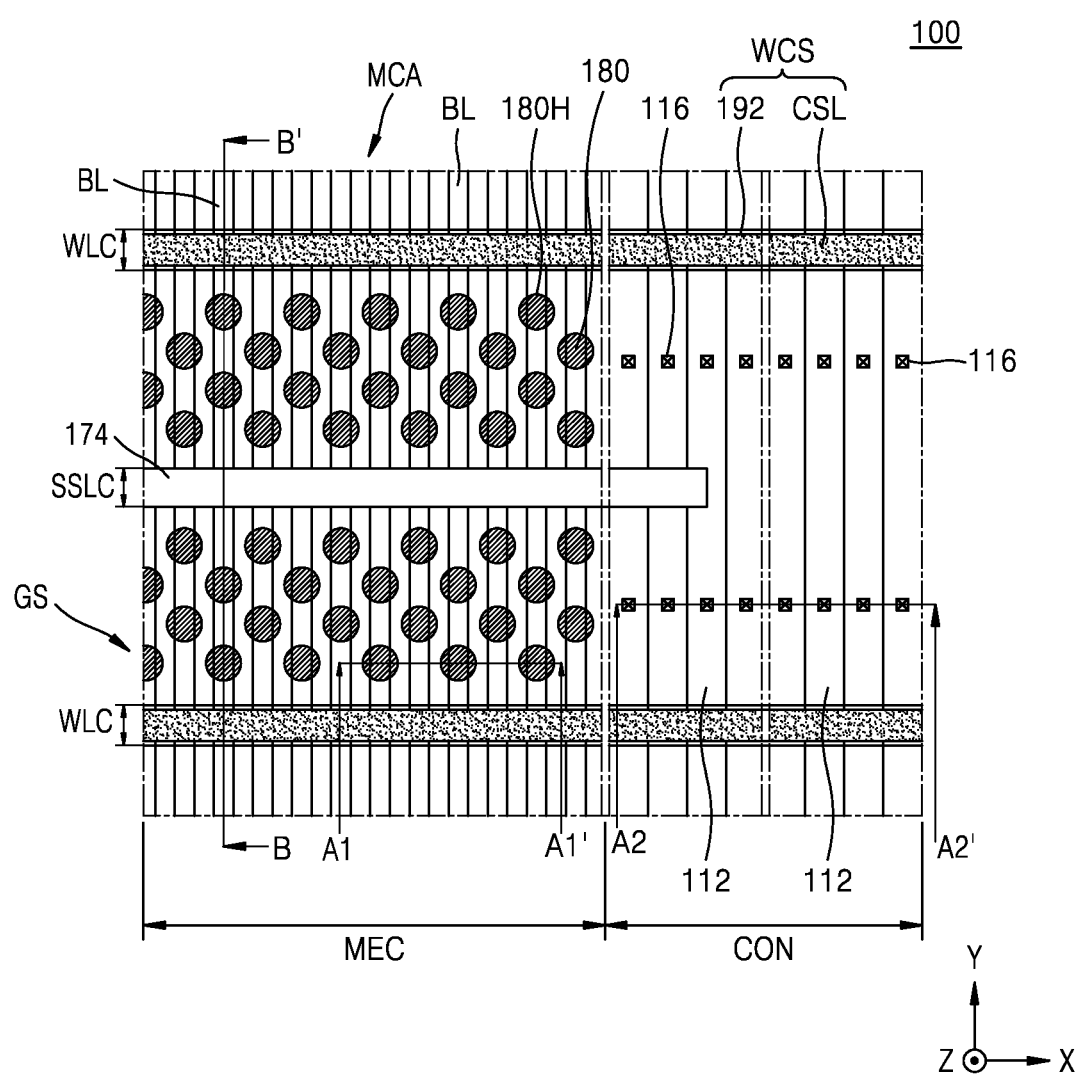
FIG. 4 is a plan view showing main components of a vertical non-volatile memory device according to an embodiment of the inventive concept.
Figure 5A:
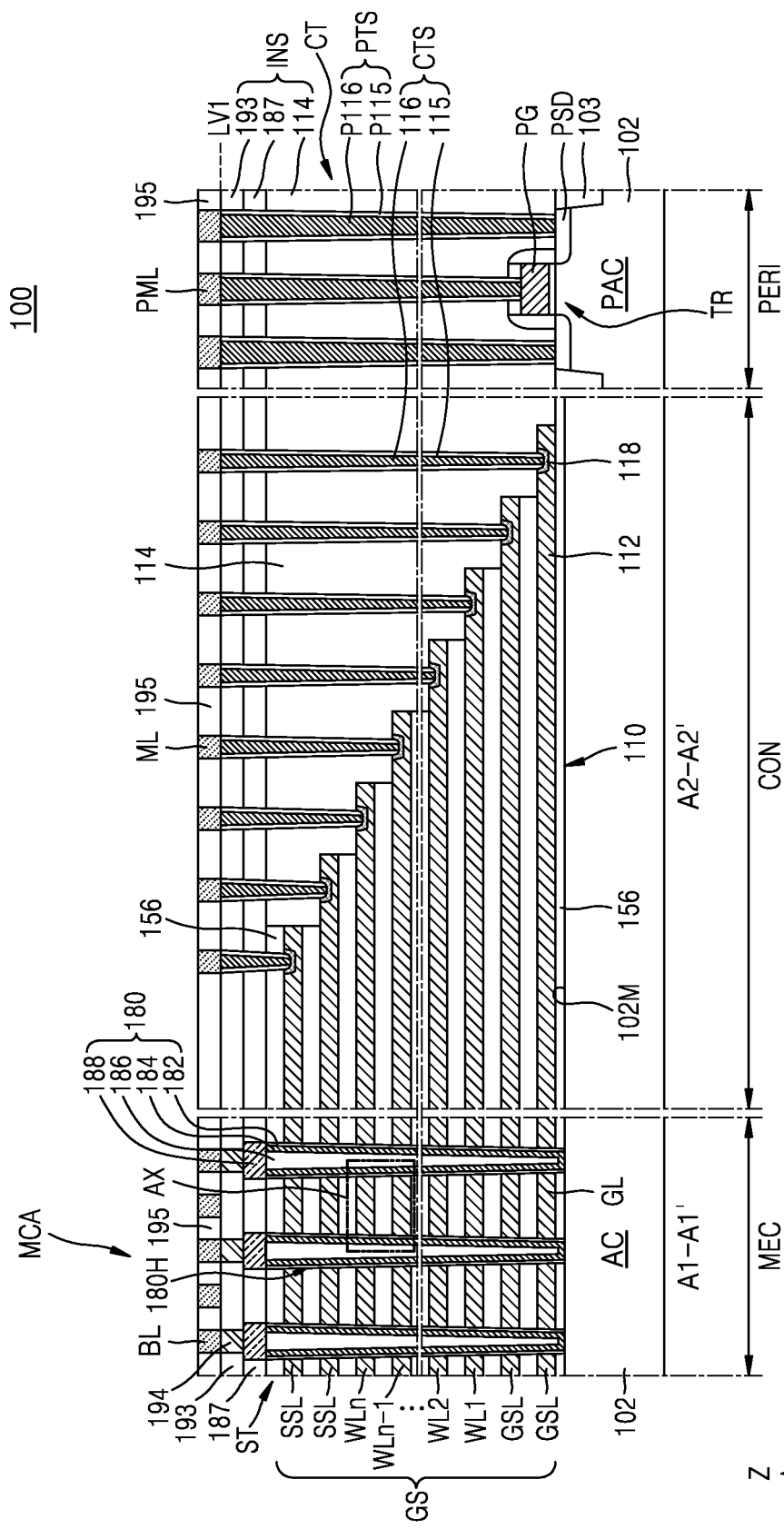
FIG. 5A is a cross-sectional view showing cross-sectional configurations of the vertical non-volatile memory device taken along lines A1-A1' and A2-A2' of FIG. 4 and a cross-sectional configuration of a peripheral circuit area of FIG. 4.
Figure 5B:
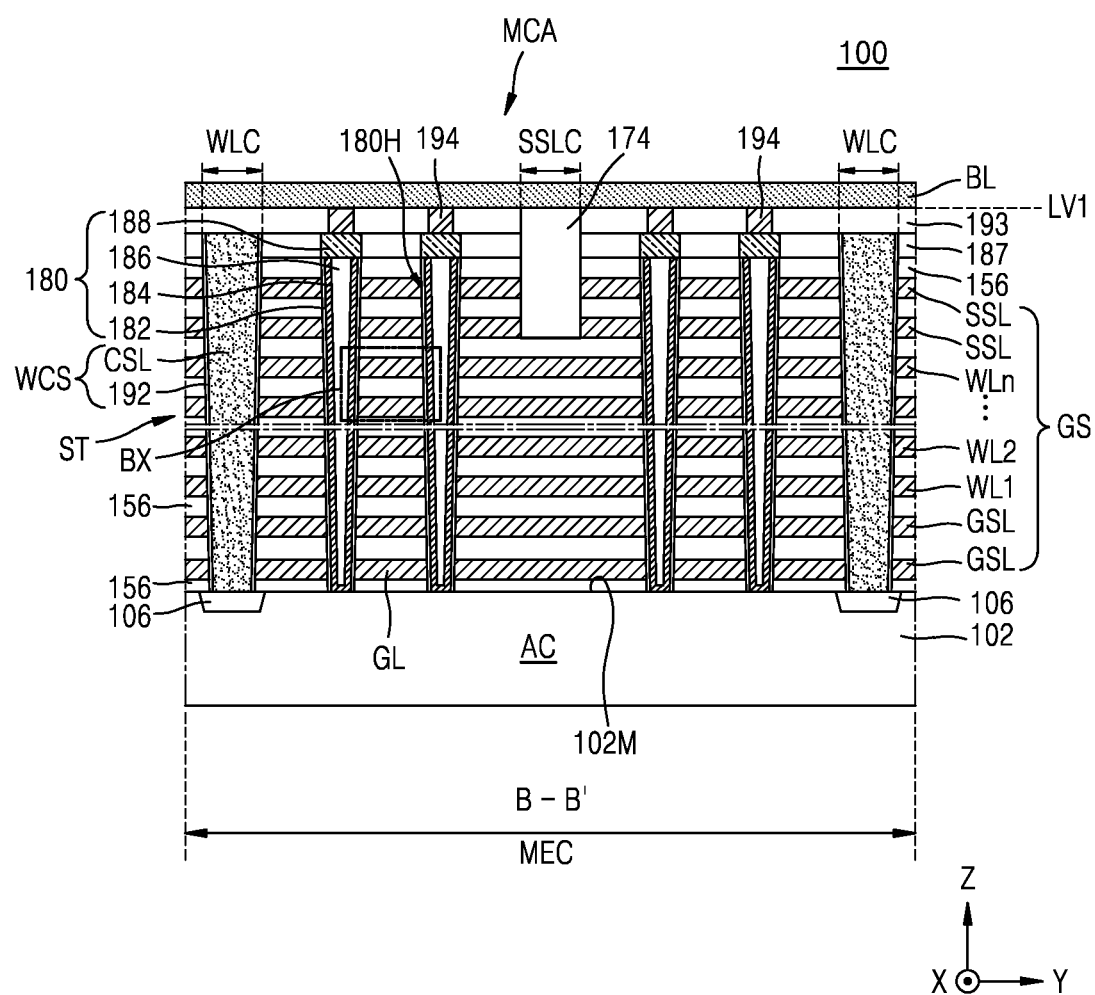
FIG. 5B is a cross-sectional view showing a cross-sectional configuration of the vertical non-volatile memory device taken along line B-B' of FIG. 4.

FIG. 4 is a plan view showing main components of a vertical non-volatile memory device 100 according to an embodiment of the inventive concept. FIG. 5A is a cross-sectional view showing cross-sectional configurations of the vertical non-volatile memory device 100 taken along lines A1-A1' and A2-A2' of FIG. 4 and a cross-sectional configuration of a peripheral circuit area of FIG. 4. FIG. 5B is a cross-sectional view showing a cross-sectional configuration of the vertical non-volatile memory device 100 taken along line B-B' of FIG. 4.

In detail, FIGS. 4, 5A, and 5B may be a diagram illustrating the vertical non-volatile memory device 10 described above with reference to FIGS. 1, 2A, 2B, and 3. However, for convenience, a peripheral circuit area PERI of FIG. 5A may include the peripheral circuit structure PCS of FIG. 2B. The vertical non-volatile memory device 100 may be a charge-trap type flash memory device.

Referring to FIGS. 4, 5A, and 5B, the vertical non-volatile memory device 100 includes a memory cell area MEC, a connection area CON, and a substrate 102 having the peripheral circuit area PERI. The substrate 102 may have a main surface 102M extending in a horizontal direction along an X-Y plane. The substrate 102 may include silicon (Si), germanium (Ge), or SiGe. A memory cell array MCA may be arranged on an active region AC of the memory cell area MEC.

The connection area CON may be arranged adjacent to an edge of the memory cell area MEC. The memory cell area MEC may be separated from the peripheral circuit area PERI with the connection area CON therebetween. Although FIG. 5A shows that the connection area CON is located on only one side of the memory cell area MEC, connection areas CON may be arranged on both sides of the memory cell area MEC in a first horizontal direction (an X direction).

A gate stack GS is provided on the memory cell area MEC and the connection area CON of a substrate 102. The gate stack GS may include a plurality of gate lines GL, a plurality of conductive pad regions 112 integrally connected to the gate lines GL, and interlayer insulating layers 156 arranged between the gate lines GL.

The gate stack GS may include the gate lines GL and the interlayer insulating layers 156 alternately stacked in the vertical direction (the third direction or Z direction). The vertical direction (the third direction or Z direction) may be a stacking direction in which the gate lines GL and the interlayer insulating layers 156 are stacked.

A portion of the gate stack GS arranged on the memory cell area MEC may constitute a memory stack structure ST. The memory stack structure ST may include 48, 64, 96, or 128 gate lines GL stacked in the vertical direction (the Z direction), but the inventive concept is not limited to the above examples.

The gate lines GL included in the gate stack GS are arranged on the memory cell area MEC, extend in the horizontal direction parallel to the main surface 102M of the substrate 102, and overlap one another in the vertical direction (the Z direction). The gate lines GL may include a plurality of word lines WL1 through WLn (n being a positive integer), at least one ground selection line GSL, and at least one string selection line SSL.

FIGS. 5A and 5B illustrate examples in which the gate lines GL include two (2) ground selection lines GSL and two (2) string selection lines SSL, but embodiments of the inventive concept is not limited thereto.

As illustrated in FIGS. 5A and 5B, the interlayer insulating layers 156 are between the substrate 102 and a ground selection line GSL, between a pair of ground selection lines GSL, between the word lines WL1 through WLn, and between a pair of string selection lines SSL. The interlayer insulating layer 156 closest to the substrate 102 among the interlayer insulating layers 156 on the substrate 102 may have a smaller thickness than the other interlayer insulating layers 156. The interlayer insulating layer 156 may be formed of silicon oxide.

The conductive pad regions 112 included in the gate stack GS are arranged on the connection area CON to form a stepped connection part 110. The conductive pad regions 112 may be integrally connected to the gate lines GL.

As illustrated in FIGS. 4 and 5B, a plurality of word line cut regions WLC may extend in the first horizontal direction (the X direction) parallel to the main surface 102M of the substrate 102. The word line cut regions WLC may define a width of the gate stack GS in a second horizontal direction (a Y direction) perpendicular to the first horizontal direction (the X direction). The gate stacks GS may be repeatedly arranged to be spaced apart from each other at certain intervals by the word line cut regions WLC.

As illustrated in FIG. 5B, a plurality of common source regions 106 may extend in the first horizontal direction (the X direction) in the substrate 102. In example embodiments, the common source regions 106 may be impurity regions doped with high-concentration n-type impurities. A plurality of common source lines CSL may extend in the first horizontal direction (the X direction) on the common source regions 106.

The common source lines CSL may be formed to fill portions of the word line cut regions WLC on a side of gate stack GS. The common source lines CSL in the word line cut regions WLC may be surrounded by insulating spacers 192. The common source line CSL and the insulating spacer 192 may construct a word line cut structure WCS penetrating the memory stack structure ST.

As shown in FIG. 5B, two string selection lines SSL neighboring in the second horizontal direction (the Y direction) may be separated from each other with a string selection line cut region SSLC therebetween. The string selection line cut region SSLC may be filled with an insulating layer 174. The insulating layer 174 may include an oxide layer, a nitride layer, or a combination thereof. In example embodiments, at least a portion of the string selection line cut region SSLC may be filled with an air gap.

The gate lines GL and the conductive pad regions 112 may each include a metal, a conductive metal nitride, or a combination thereof. For example, the gate lines GL and the conductive pad regions 112 may be each formed of tungsten (W), nickel (Ni), cobalt (Co), tantalum (Ta), tungsten nitride (WN), titanium nitride (TiN), tantalum nitride (TaN), or a combination thereof, but the present inventive concept is not limited thereto.

In the memory cell area MEC, a plurality of channel structures 180 may extend longitudinally in the vertical direction (the Z direction), i.e., in a stacking direction, while being in contact with channel holes 180H that penetrate the gate lines GL and the interlayer insulating layers 156. The channel structures 180 may be arranged to be spaced apart from each other by a certain interval in the first horizontal direction (X direction) and the second horizontal direction (Y direction).

Each of the channel structures 180 may include an information storage structure 182, a channel layer 184, a buried insulating layer 186, and a drain region 188. The channel layer 184 may include doped polysilicon and/or undoped polysilicon.

The channel layer 184 may have a cylindrical structure with an inner space. The inner space of the channel layer 184 having the cylindrical structure may be filled with the buried insulating layer 186. The buried insulating layer 186 may be formed of an insulating material. For example, the buried insulating layer 186 may be formed of silicon oxide, silicon nitride, silicon oxynitride (SiON), or a combination thereof. In example embodiments, the buried insulating layer 186 may be omitted, and the channel layer 184 may have a pillar structure without an inner space. A configuration of the channel structure 180 is described in more detail later.

The drain region 188 may be formed of polysilicon doped with impurities, a metal, a conductive metal nitride, or a combination thereof. Examples of the metal capable of forming the drain region 188 may include W, Ni, Co, and Ta. The drain regions 188 may be insulated from each other by an intermediate insulating layer 187. The intermediate insulating layer 187 may include an oxide layer, a nitride layer, or a combination thereof.

The conductive pad regions 112 constituting the stepped connection part 110 on the connection area CON may have a width that gradually decreases in a horizontal direction away from the substrate 102.

In the memory cell area MEC, a plurality of bit lines BL may be arranged on the memory stack structure ST. A plurality of bit line contact pads 194 may be between the channel structures 180 and the bit lines BL. The bit line contact pads 194 may be insulated from each other by a first upper insulating layer 193. The bit lines BL may be insulated from each other by a second upper insulating layer 195.

The bit line contact pads 194 and the bit lines BL may be each formed of a metal, metal nitride, or a combination thereof. For example, the bit line contact pads 194 and the bit lines BL may be each formed of W, Ti, Ta, copper (Cu), aluminum (Al), TiN, TaN, WN, or a combination thereof. The first and second upper insulating layers 193 and 195 may each include an oxide layer, a nitride layer, or a combination thereof.

A cover insulating layer 114 covering the stepped connection part 110 may be between the substrate 102 and the intermediate insulating layer 187 in the connection area CON. The cover insulating layer 114 may cover the conductive pad regions 112. The cover insulating layer 114, the intermediate insulating layer 187, and the first upper insulating layer 193 may constitute an insulating structure INS.

In the connection area CON, a plurality of contact structures CTS may be arranged on the conductive pad regions 112 of the stepped connection part 110 to extend longitudinally in the vertical direction (the Z direction). A plurality of metal silicide layers 118 may be in connection portions between the contact structures CTS and the conductive pad regions 112. Each of the contact structures CTS may include a contact plug 116 extending longitudinally in the vertical direction (the Z direction) and an insulating plug 115 surrounding the contact plug 116.

A plurality of wiring layers (or interconnection layers) ML may be respectively arranged on the contact structures CTS in the connection area CON. The wiring layers ML may be arranged at the same level as the bit lines BL in the memory cell area MEC. Each of the wiring layers ML may be connected to the contact plug 116 of the contact structure CTS at a first vertical level LV1. The wiring layers ML may not include a portion that vertically overlaps the memory stack structure ST. The wiring layers ML may be insulated from each other by the second upper insulating layer 195 in the connection area CON.

The contact plugs 116 and the wiring layers ML may be each formed W, Ti, Ta, Cu, Al, TiN, TaN, WN, or a combination thereof. The insulating plugs 115 include a silicon nitride layer, a silicon oxide layer, or a combination thereof.

A plurality of circuits CT may be arranged on the peripheral circuit area PERI. The circuits CT may be arranged at a vertical level equal to or higher than that of the substrate 102. The device isolation layer 103 for defining a peripheral active region PAC may be arranged in the peripheral circuit area PERI of the substrate 102. A peripheral transistor TR may be formed on a peripheral active region PAC.

The peripheral transistor TR may constitute a part of the circuits CT arranged on the peripheral circuit area PERI. The peripheral transistor TR may include a peripheral gate PG and peripheral source/drain regions PSD formed in the peripheral active region PAC at both sides of the peripheral gate PG. In example embodiments, unit devices such as a resistor, a capacitor, and the like may be further arranged on the peripheral circuit area PERI.

A plurality of peripheral contact structures PTS may be arranged on the peripheral circuit area PERI. The peripheral contact structures PTS may extend in the vertical direction (the Z direction) from the peripheral transistor TR up to the first vertical level LV1 through the cover insulating layer 114. Each of the peripheral contact structures PTS may include a peripheral contact plug P116 extending longitudinally in the vertical direction (the Z direction) and a peripheral insulating plug P115 surrounding the peripheral contact plug P116.

Each of the peripheral wiring layers PML may be arranged on the peripheral contact plug P116. The peripheral wiring layers PML may extend in the horizontal direction at the first vertical level LV1 that is the same level as the level of the wiring layers ML arranged in the connection area CON. The peripheral wiring layers PML may be insulated from each other by the second upper insulating layer 195.

The peripheral contact plugs P116 and the peripheral wiring layers PML may be each formed of W, Ti, Ta, Cu, Al, TiN, TaN, WN, or a combination thereof. The peripheral insulating plugs P115 may include a silicon nitride layer, a silicon oxide layer, or a combination thereof.

Figure 6:
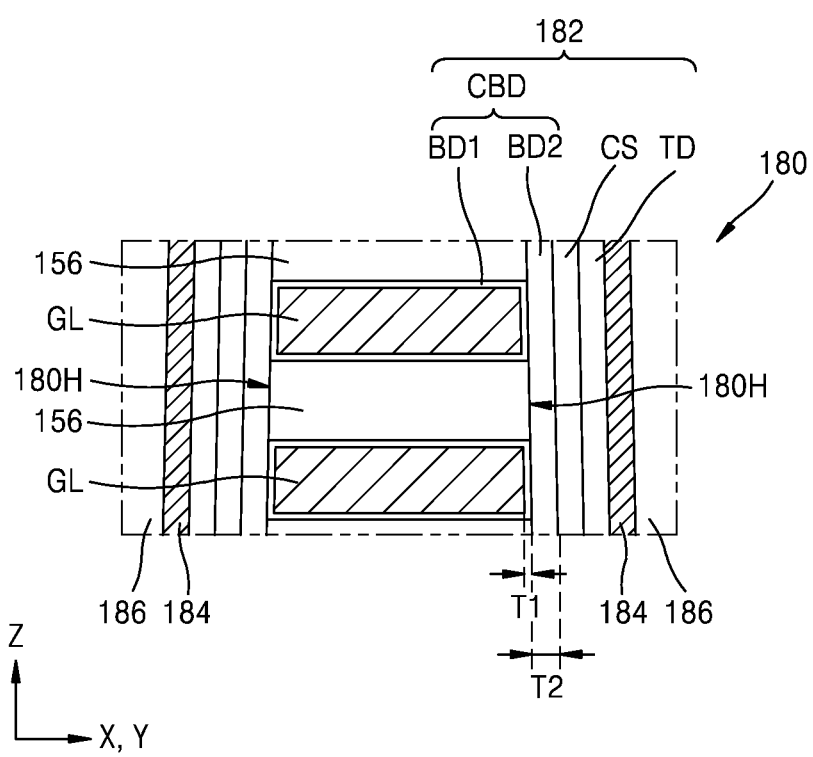
FIG. 6 is an enlarged cross-sectional view of partial regions of FIGS. 5A and 5B.

FIG. 6 is an enlarged cross-sectional view of partial regions of FIGS. 5A and 5B.

In detail, FIG. 6 may be an enlarged diagram of regions "AX" of FIG. 5A and "BX" of FIG. 5B. FIG. 6 may be an enlarged diagram illustrating the gate lines GL and the channel structure 180 of FIGS. 5A and 5B. FIG. 6 is provided for describing in detail the information storage structure 182 of FIGS. 5A and 5B.

As described above, the channel structure 180 may include the information storage structure 182, the channel layer 184, and the buried insulating layer 186. The channel layer 184 may be arranged within the channel hole 180H of the memory stack structure (ST of FIGS. 5A and 5B). The information storage structure 182 includes a composite blocking insulating layer CBD, a charge storage layer CS, and a tunneling insulating layer TD sequentially formed from the gate lines GL in the horizontal direction, i.e., the first and second horizontal directions (X and Y directions), to the channel layer 184.

The composite blocking insulating layer CBD may include a metal oxide having a higher dielectric constant than silicon oxide. The composite blocking insulating layer CBD may include a metal oxide having a dielectric constant greater than 3.9 (e.g., greater than 4.2), which is a dielectric constant of silicon oxide. In some embodiments, metal oxides used in the composite blocking insulating layer CBD may have a dielectric constant of 5 to 60. When the composite blocking insulating layer CBD includes a metal oxide having a higher dielectric constant than silicon oxide, an operation speed of a device may be increased by increasing a strength of an electric field passing through the tunneling insulating layer TD.

In addition, the composite blocking insulating layer CBD includes a plurality of blocking insulating layers, e.g., first and second blocking insulating layers BD1 and BD2, arranged in a descending order of oxidation density (e.g., oxygen areal density or oxidation areal density) in the horizontal direction from the gate lines GL to the channel layer 184. When the first and second blocking insulating layers BD1 and BD2 constituting the composite blocking insulating layer CBD have different oxidation densities, a dipole may be formed between the first and second blocking insulating layers BD1 and BD2 to improve charge shielding properties.

The composite blocking insulating layer CBD may include a metal oxide having a larger oxidation density than silicon oxide or a metal oxide having a smaller oxidation density than that. The composite blocking insulating layer CBD may include at least two selected from aluminum oxide, titanium oxide, tantalum oxide, magnesium oxide, hafnium oxide, zirconium oxide, scandium oxide, germanium oxide, ruthenium oxide, yttrium oxide, lanthanum oxide, and strontium oxide. The oxidation density (oxygen areal density or oxidation areal density) of the composite blocking insulating layer CBD is described in more detail later.

Although it has been described in this embodiment that the composite blocking insulating layer CBD is composed of two blocking insulating layers, i.e., the first and second blocking insulating layers BD1 and BD2, the inventive concept is not limited thereto. For example, the composite blocking insulating layer CBD may be composed of a plurality of blocking insulating layers, e.g., several to several tens of blocking insulating layers.

The first blocking insulating layer BD1 in the composite blocking insulating layer CBD may surround the gate lines GL. The first blocking insulating layer BD1 may be positioned so that portions of the first blocking insulating layer BD1 surrounding the gate lines GL face each other between the gate lines GL in a stacking direction, i.e., a vertical direction (a Z-axis direction). The first blocking insulating layer BD1 may have a first thickness T1. The first blocking insulating layer BD1 may include multiple portions, each of which may surround a respective one of the gate lines GL, and those multiple portions may contact the second blocking insulating layer BD2 as illustrated in FIG. 6. The portions of the first blocking insulating layer BD1 may include the same material and may be formed through the same process that will be described with reference to FIG. 12C. "An element A surrounding an element B" (or similar language) as used herein means that the element A is at least partially around the element B but does not necessarily mean that the element A completely encloses the element B.

The second blocking insulating layer BD2 may be a continuous layer formed in the channel hole 180H to extend in the stacking direction, i.e., the vertical direction (the Z-axis direction). The second blocking insulating layer BD2 may have a second thickness T2 that is greater than the thickness T1. The first and second thicknesses T1 and T2 may each be a thickness of several tens of angstroms (Å). In addition, relative thicknesses of the tunneling insulating layer TD, the charge storage layer CS, and the blocking insulating layers BD1 and BD2 are not limited to the example of FIG. 6, and may be variously modified. The second blocking insulating layer BD2 may extend along a surface of the channel hole 180H in the stacking direction as illustrated in FIG. 6. The second blocking insulating layer BD2 may overlap at least two gate lines GL in the horizontal direction (e.g., X and Y directions) as illustrated in FIG. 6. In some embodiments, the second blocking insulating layer may overlap all of the gate lines GL, from a lowermost gate line GL to an uppermost gate line GL, in the horizontal direction as illustrated in FIG. 5B. As used herein, "an element A overlapping an element B in a direction X" (or similar language) means that there is at least one line that extends in the direction X and intersects both the elements A and B.

The charge storage layer CS may be a region where electrons passing through the tunneling insulating layer TD from the channel layer 184 are stored or trapped during a program operation. The electrons stored in the charge storage layer CS may move back to the channel layer 184 through the tunneling insulating layer TD during an erase operation.

The charge storage layer CS may include silicon nitride, boron nitride, silicon boron nitride, or polysilicon doped with impurities. The tunneling insulating layer TD may include silicon oxide, hafnium oxide, aluminum oxide, zirconium oxide, tantalum oxide, etc. The charge storage layer CS may include a continuous layer that extends in the vertical direction between the composite blocking insulating layer CBD and the tunneling insulating layer TD (e.g., between sides of the composite blocking insulating layer CBD and the tunneling insulating layer TD). In some embodiments, the charge storage layer CS may overlap multiple gate lines GL in the horizontal direction (e.g., X and Y directions). The tunneling insulating layer TD may include a continuous layer that extends in the vertical direction between the charge storage layer CS and the channel layer 184 (e.g., between sides of the charge storage layer CS and the channel layer 184). In some embodiments, the tunneling insulating layer TD may overlap multiple gate lines GL in the horizontal direction (e.g., X and Y directions).

Figure 7:
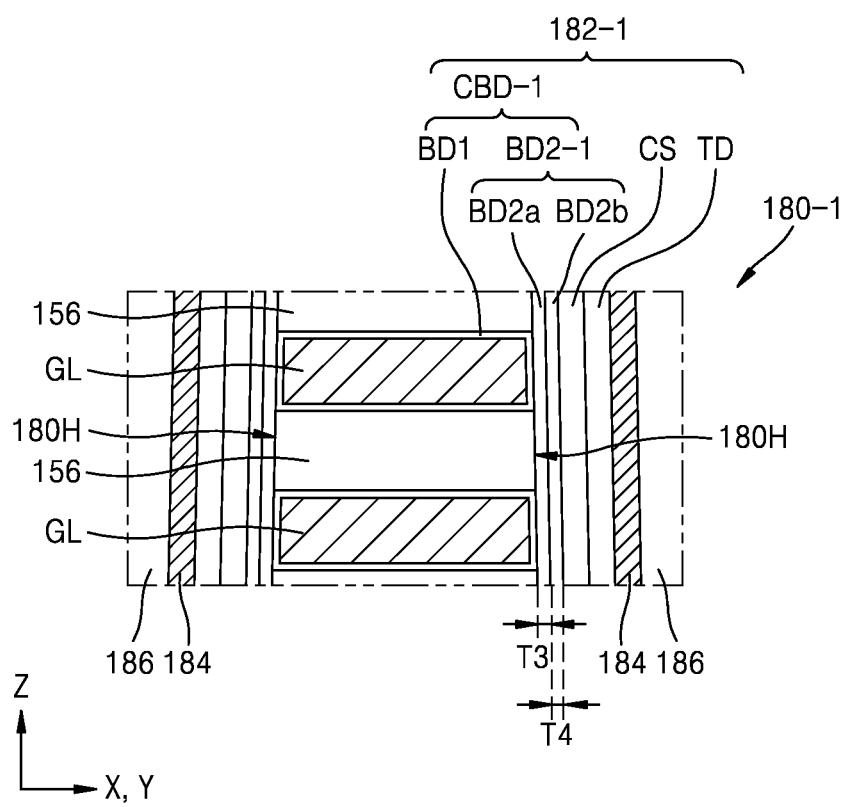
FIG. 7 is an enlarged cross-sectional view of parts of gate lines and a channel structure of a vertical non-volatile memory device, according to an embodiment of the inventive concept.

FIG. 7 is an enlarged cross-sectional view of parts of gate lines GL and a channel structure 180-1 of a vertical nonvolatile memory device, according to an embodiment of the inventive concept.

In detail, the channel structure 180-1 of FIG. 7 is the same as or similar to the channel structure 180 of FIG. 6 except for an information storage structure 182-1 constituting the channel structure 180-1. In FIG. 7, the same reference numerals as those shown in FIG. 6 denote the same elements. Descriptions already provided above with reference to FIG. 6 are briefly given or omitted herein.

The channel structure 180-1 may include the information storage structure 182-1, a channel layer 184, and a buried insulating layer 186. The channel layer 184 may be arranged within the channel hole 180H of the memory stack structure (ST of FIGS. 5A and 5B). The information storage structure 182-1 includes a composite blocking insulating layer CBD-1, a charge storage layer CS, and a tunneling insulating layer TD sequentially formed from the gate lines GL in the horizontal direction, i.e., the first and second horizontal directions (X and Y directions), of the channel layer 184.

The composite blocking insulating layer CBD-1 may include a metal oxide having a higher dielectric constant than silicon oxide. For example, the composite blocking insulating layer CBD-1 may include a metal oxide having a dielectric constant greater than 3.9 (e.g., greater than 4.2). The composite blocking insulating layer CBD-1 includes a plurality of blocking insulating layers arranged in a descending order of oxidation density (oxygen areal density or oxidation areal density) in the horizontal direction from the gate lines GL to the channel layer 184. The composite blocking insulating layer CBD-1 may include first and second blocking insulating layers BD1 and BD2-1. The second blocking insulating layer BD2-1 may include a plurality of sub-blocking insulating layers.

The sub-blocking insulating layers may include a first sub-blocking insulating layer BD2a arranged on one side of the first blocking insulating layer BD1 and a second sub-blocking insulating layer BD2b arranged between the first sub-blocking insulating layer BD1a and the charge storage layer CS.

The first sub-blocking insulating layer BD2a may have a third thickness T3 in the first horizontal direction (X direction) or the second horizontal direction (Y direction). The second sub-blocking insulating layer BD2b may have a fourth thickness T4 in the first horizontal direction (X direction) or the second horizontal direction (Y direction). The third and fourth thicknesses T3 and T4 may each be a thickness of several tens of Å.

The second sub-blocking insulating layer BD2b may include a metal oxide having a lower oxidation density than the first sub-blocking insulating layer BD2a. Although it has been described in this embodiment that the second blocking insulating layer BD2-1 includes two sub-blocking insulating layers, i.e., the first and second sub-blocking insulating layers BD2a and BD2b, the inventive concept is not limited thereto, and the second blocking insulating layer BD2-1 may include three or more sub-blocking insulating layers.

Figure 8A:
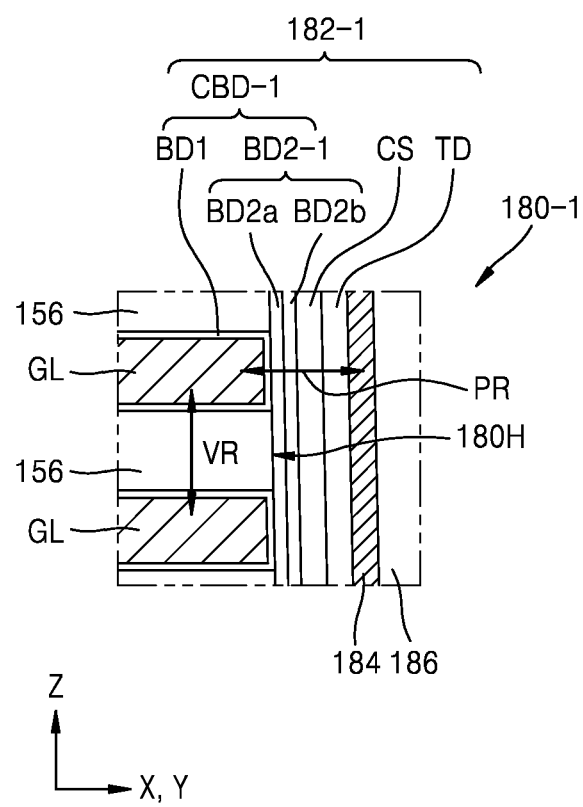
FIG. 8A is a partial cross-sectional view of the parts of FIG. 7.
Figure 8B:
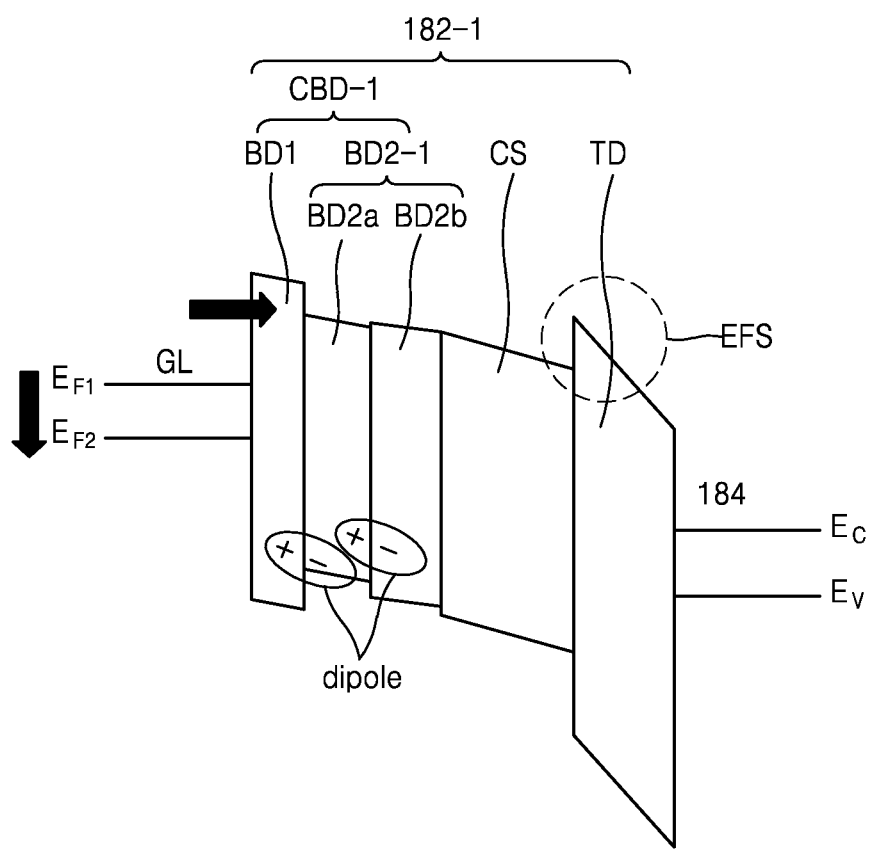
FIG. 8B is an energy band diagram between a gate line and a channel layer of FIG. 8A.
Figure 8C:
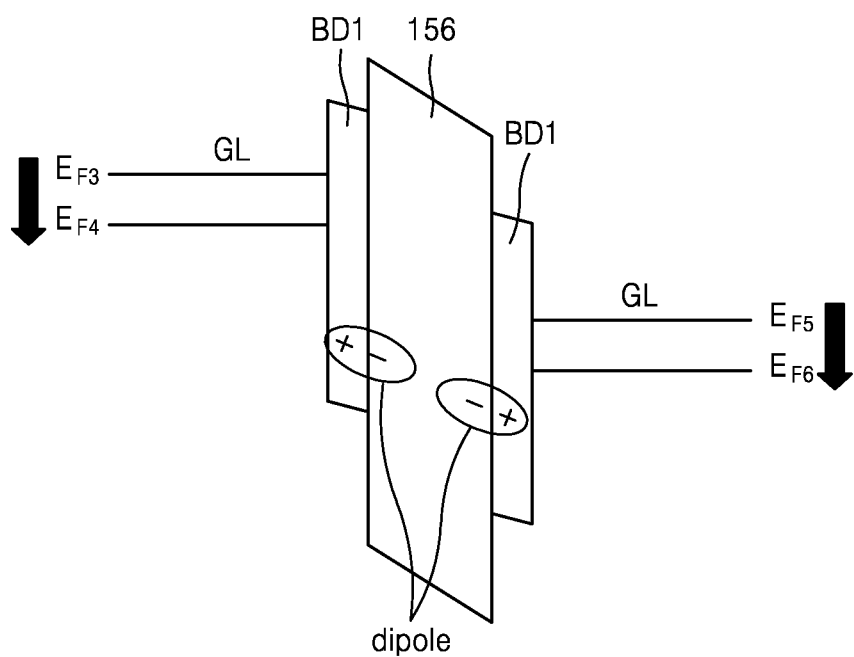
FIG. 8C is an energy band diagram between gate lines of FIG. 8A.

FIG. 8A is a partial cross-sectional view of the parts of FIG. 7, FIG. 8B is an energy band diagram between the gate line GL and the channel layer 184 of FIG. 8A, and FIG. 8C is an energy band diagram between the gate lines GL of FIG. 8A.

Referring to FIGS. 8A and 8B, the composite blocking insulating layer CBD-1, the charge storage layer CS, and the tunneling insulating layer TD are arranged in a horizontal line between the gate line GL and the channel layer 184, as shown in FIG. 8A. The first blocking insulating layer BD1, the second blocking insulating layer BD2-1, the charge storage layer CS, and the tunneling insulating layer TD are located sequentially in the horizontal line from the gate lines GL to the channel layer 184.

FIG. 8B is a band diagram during an erase operation in which a lower voltage is applied to the gate line GL than to the channel layer 184. In FIG. 8B, the tunneling insulating layer TD is formed of silicon oxide, and the charge storage layer CS is formed of silicon nitride, the composite blocking insulating layer CBD-1 includes a metal oxide having a higher dielectric constant than silicon oxide, and the channel layer 184 is formed of polysilicon. The channel layer 184 is indicated by a conduction band energy level $E_c$ and a valance band energy level $E_v$.

When the composite blocking insulating layer CBD-1 includes a metal oxide having a higher dielectric constant than silicon oxide, a strength of an electric field passing through the tunneling insulating layer TD as indicated by a reference symbol EFS of FIG. 8B may be increased to increase a speed of an erase operation.

In addition, when the composite blocking insulating layer CBD-1 is arranged in decreasing order of oxidation density (oxygen areal density or oxidation areal density) in a direction of the horizontal line PR from the gate lines GL to the channel layer 184, as shown in FIG. 8B, dipoles may be formed at an interface between the first blocking insulating layer BD1 and the first sub-blocking insulating layer BD2*a* and an interface between the first and second sub-blocking insulating layers BD2*a* and BD2*b* due to a difference between oxidation densities thereof. The dipoles may create an electric field. When layers having a large difference in oxidation density therebetween are arrange, a magnitude (or strength) of the electric field may be increased.

A positive charge and a negative charge may be respectively created on surfaces of the first blocking insulating layer BD1 and the first sub-blocking insulating layer BD2*a*. A positive charge and a negative charge may be respectively created on surfaces of the first and second sub-blocking insulating layers BD2*a* and BD2*b*. Dipoles formed on the composite blocking insulating layer CBD-1 are described in more detail later.

When the dipoles on the composite blocking insulating layer CBD-1 create an electric field, the same effect as lowering the Fermi energy level of the gate line GL from $E_{F1}$ to $E_{F2}$ is achieved. In other words, this may lead to an increase in a work function of the gate line GL.

In this case, a barrier of the composite blocking insulating layer CBD-1 increases as indicated by an arrow to impede movement of charges from the composite blocking insulating layer CBD-1 to the charge storage layer CS. As a result, the composite blocking insulating layer CBD-1 may exhibit improved charge shielding properties.

Referring to FIGS. 8A and 8C, an upper first blocking insulating layer BD1, an interlayer insulating layer 156, and a lower first blocking insulating layer BD1 are arranged in a vertical line VR between upper and lower gate lines GL, as shown in FIG. 8A. FIG. 8C is a band diagram when a lower voltage is applied to the upper gate line GL than to the lower gate line GL.

Referring to FIG. 8C, the upper and lower first blocking insulating layers BD1 are each formed of aluminum oxide, and the interlayer insulating layer 156 is formed of silicon oxide. Aluminum oxide has a higher oxidation density than silicon oxide.

Because the upper first blocking insulating layer BD1 has a higher oxidation density than the interlayer insulating layer 156, as shown in FIG. 8C, an upper dipole may be formed at an interface between the upper first blocking insulating layer BD1 and the interlayer insulating layer 156. A positive charge and a negative charge may be respectively created on surfaces of the upper first blocking insulating layer BD1 and the interlayer insulating layer 156.

Furthermore, because the interlayer insulating layer has a lower oxidation density than the lower first blocking insulating layer BD1, as shown in FIG. 8C, a lower dipole may be formed at an interface between the interlayer insulating layer 156 and the lower first blocking insulating layer BD1. A negative charge and a positive charge may be respectively created on surfaces of the interlayer insulating layer 156 and the lower first blocking insulating layer BD1.

When the upper dipole is formed between the upper first blocking insulating layer BD1 and the interlayer insulating layer 156, the Fermi energy level of the upper gate line GL may be lowered from $E_{F3}$ to $E_{F4}$. When the lower dipole is formed at the interface between the interlayer insulating layer 156 and the lower first blocking insulating layer BD1, the Fermi energy level of the lower gate line GL may be lowered from $E_{F5}$ to $E_{F6}$.

Accordingly, when the upper and lower first blocking insulating layers BD1 are further included between the upper and lower gate lines GL, a breakdown voltage between the upper and lower gate lines GL may be improved. In other words, properties of charge shielding between the upper and lower gate lines GL may be enhanced to improve a breakdown voltage.

Figure 9A:
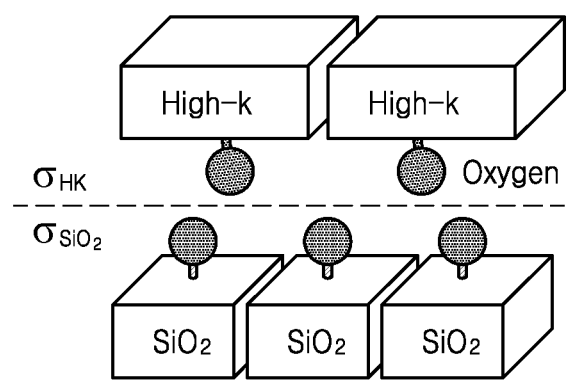
FIGS. 9A through 9C are diagrams for describing a process of forming a dipole used in a vertical non-volatile memory device according to an embodiment of the inventive concept.
Figure 9B:
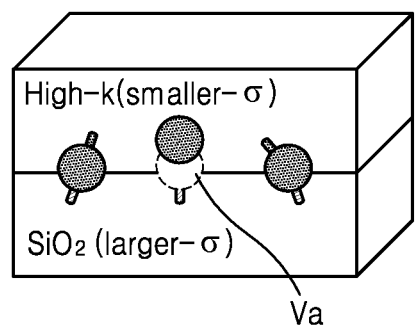
Figure 9C:
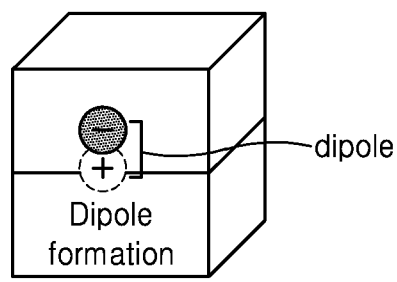

FIGS. 9A through 9C are diagrams for describing formation of a dipole used in a vertical non-volatile memory device according to embodiments of the inventive concept.

Referring to FIG. 9A, silicon dioxide ($SiO_2$) having a high oxidation density of $\sigma_{SiO2}$ is located on a lower side of FIG. 9A. A high-k metal oxide having a smaller oxidation density of $\sigma_{HK}$ and a higher dielectric constant (k) than $SiO_2$ may be located on an upper side thereof. As shown in FIG. 9A, oxygen atoms may be located between $SiO_2$ and the high-k metal oxide.

Referring to FIG. 9B, when $SiO_2$ located on the lower side closely combines with the high-k metal oxide located on the upper side, oxygen atoms move from $SiO_2$ having a large oxidation density to the high-k metal oxide having a small oxidation density. As a result, vacancies Va are formed in $SiO_2$ having a large oxidation density.

Referring to FIG. 9C, a dipole is formed between a vacancy formed in $SiO_2$ having a large oxidation density and an oxygen atom located in the high-k metal oxide having a small oxidation density. The dipole is formed at an interface between $SiO_2$ having a large oxidation density and the high-k metal oxide having a small oxidation density. A positive charge is created on a surface of $SiO_2$ having a large oxidation density, and a negative charge is created on a surface of the high-k metal oxide having a small oxidation density. Due to such a difference in oxidation density, the dipole may be formed at the interface between $SiO_2$ and the high-k metal oxide.

Figure 10:
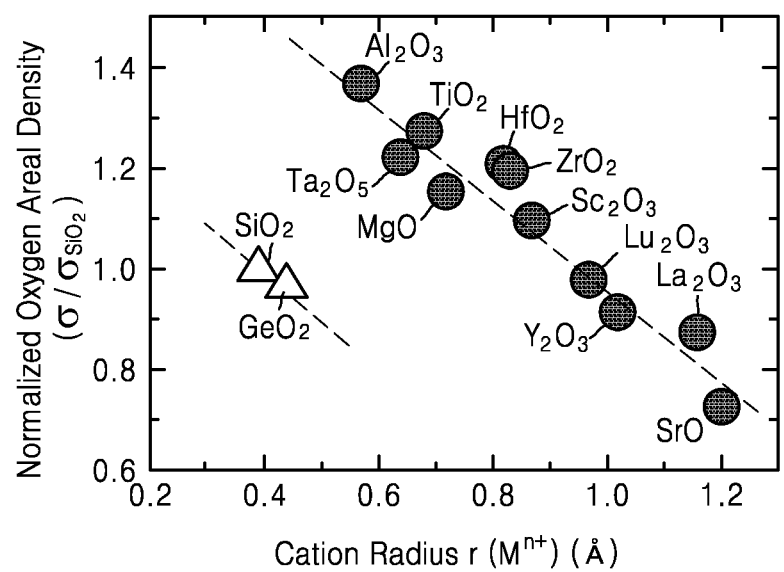
FIG. 10 is a diagram for describing metal oxides used in forming a dipole in a vertical non-volatile memory device according to an embodiment of the inventive concept.

FIG. 10 is a diagram for describing metal oxides used in forming a dipole in a vertical non-volatile memory device according to embodiments of the inventive concept.

In detail, FIG. 10 is provided to describe oxidation densities of various metal oxides. In FIG. 10, the X-axis represents a radius of a cation in a metal oxide, and the Y-axis represents an oxidation density of the metal oxide. The oxidation density may be an oxygen areal density or an oxidation areal density. The Y-axis represents an oxidation density ratio of a metal oxide to $SiO_2$, i.e., a normalized oxygen areal density or oxidation areal density.

A metal oxide may be high-k material having a higher dielectric constant than $SiO_2$. As shown in FIG. 10, the various metal oxides may include aluminum oxide, titanium oxide, tantalum oxide, magnesium oxide, hafnium oxide, zirconium oxide, scandium oxide, germanium oxide, ruthenium oxide, yttrium oxide, lanthanum oxide, and strontium oxide. The metal oxides described above are listed in the order of oxidation density as shown in FIG. 10.

As shown in FIG. 10, a metal oxide having a higher oxidation density than $SiO_2$ may be aluminum oxide, titanium oxide, tantalum oxide, magnesium oxide, hafnium oxide, zirconium oxide, or scandium oxide.

As shown in FIG. 10, a metal oxide having a lower oxidation density than $SiO_2$ may be germanium oxide, ruthenium oxide, yttrium oxide, lanthanum oxide, or strontium oxide.

The composite blocking insulating layers CBD and CBD-1 as described with reference to FIGS. 6 and 7 may be each formed of metal oxides described above. In other words, the composite blocking insulating layer CBD or CBD-1 of the vertical non-volatile memory device 10 according to embodiments of the inventive concept as described above may be formed by arranging metal oxides in the order of oxidation density in the horizontal direction from the gate lines (GL of FIGS. 6 and 7) to the channel layer (184 of FIGS. 6 and 7).

For example, when the first blocking insulating layer BD1 of FIG. 6 is formed of aluminum oxide, the second blocking insulating layer BD2 may be formed of one of metal oxides having a smaller oxidation density than the aluminum oxide or a combination thereof.

Furthermore, when the first blocking insulating layer BD1 of FIG. 7 is formed of aluminum oxide, the second blocking insulating layer BD2-1 may be formed of one of metal oxides having a smaller oxidation density than the aluminum oxide or a combination thereof. The second sub-blocking insulating layer BD2*b* of FIG. 7 may be formed of a metal oxide having a lower oxidation density than the first sub-blocking insulating layer BD2*a* from among the metal oxides described above.

Figure 11:
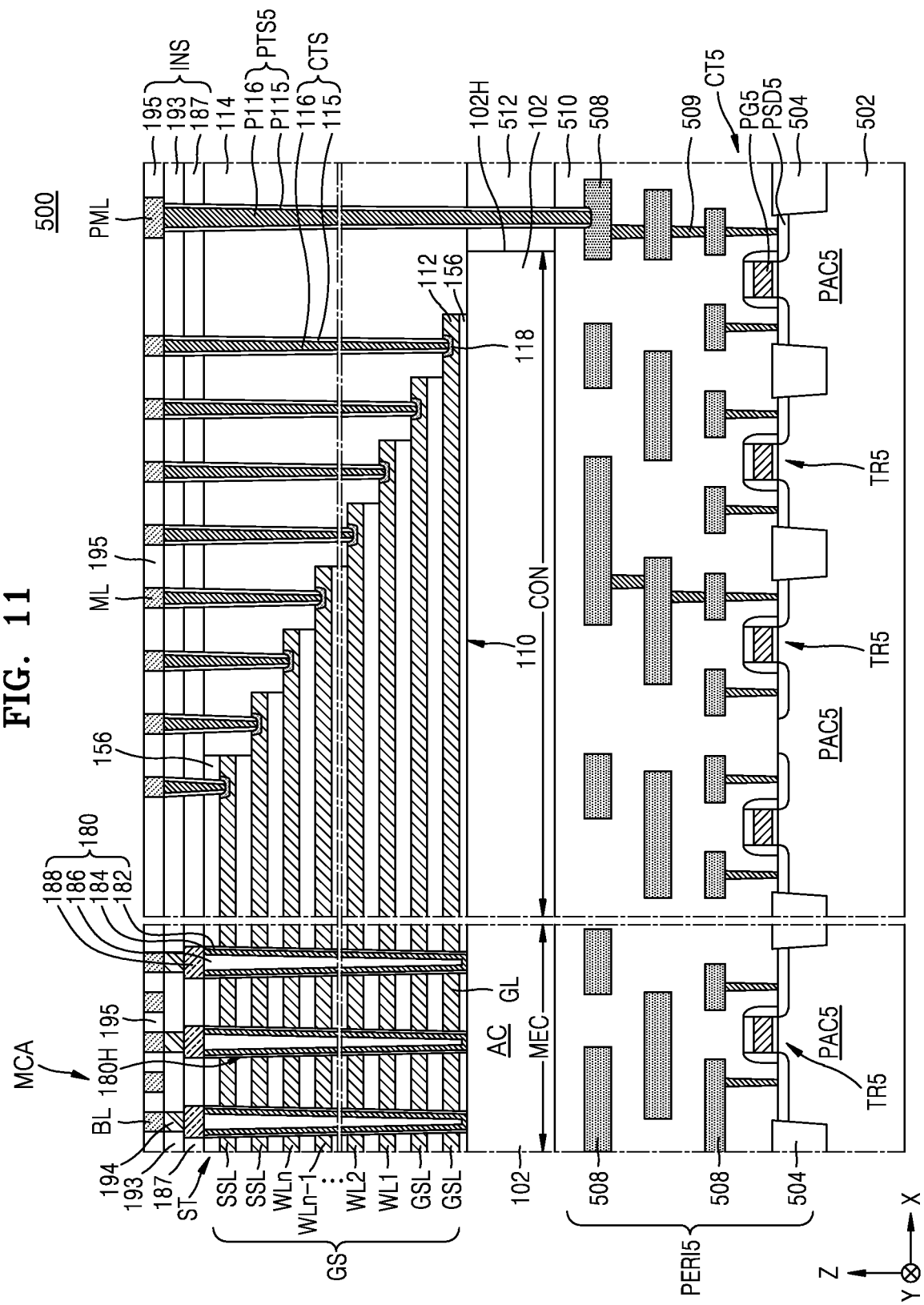
FIG. 11 is a cross-sectional view for explaining a vertical non-volatile memory device according to an embodiment of the inventive concept.

FIG. 11 is a cross-sectional view for explaining a vertical non-volatile memory device 500 according to an embodiment of the inventive concept.

In detail, the vertical non-volatile memory device 500 has substantially the same configuration as the vertical non-volatile memory device 100 described with reference to FIGS. 4, 5A, 5B, and 6. The vertical non-volatile memory device 500 may include channel structures 180 having the same configuration as the channel structure 180 described with reference to FIG. 6.

However, the vertical non-volatile memory device 500 includes a peripheral circuit area PERI5 formed at a level lower than a level of a substrate 102. Descriptions already provided above with respect to FIGS. 4, 5A, 5B, and 6 are briefly given or omitted herein.

A memory cell area MEC and a connection area CON may be arranged to vertically overlap the peripheral circuit area PERI5. In the connection area CON, a plurality of contact structures CTS may be respectively arranged on a plurality of conductive pad regions 112 of a stepped connection part 110 and extend longitudinally in the vertical direction (the Z direction). A plurality of metal silicide layers 118 may be in connection portions between the contact structures CTS and the conductive pad regions 112.

The peripheral circuit area PERI5 may include a peripheral circuit board 502 arranged below the substrate 102 and a plurality of circuits CT5 arranged between the peripheral circuit board 502 and the substrate 102. Detailed configurations of the peripheral circuit board 502 and the circuits CT5 may be substantially the same as those of the substrate 102 and the circuits CT described with reference to FIGS. 5A and 5B.

A peripheral circuit active region PACS may be defined by a device isolation layer 504 in the peripheral circuit board 502. A plurality of transistors TR5 may be formed on the peripheral circuit active region PACS. The transistors TR5 may each include a peripheral gate PG5 and peripheral source/drain regions PSD5 formed in the peripheral active region PACS at both sides of the peripheral gate PG5. In example embodiments, unit devices such as a resistor, a capacitor, and the like may be further arranged on the peripheral circuit area PERI5. A peripheral insulating layer 510 may be formed on the transistors TR5. The peripheral insulating layer 510 may include silicon oxide, SiON, silicon oxycarbonitride (SiOCN), and the like.

The peripheral circuit area PERI5 may include a plurality of peripheral circuit wiring layers 508 and a plurality of peripheral circuit contacts 509. Some of the peripheral circuit wiring layers 508 may be configured to be electrically connectable to the transistors TR5. The peripheral circuit contacts 509 may be configured to interconnect some of the peripheral circuit wiring layers 508. The peripheral circuit wiring layers 508 and the peripheral circuit contacts 509 may be covered with the peripheral insulating layer 510. Some of the peripheral circuit wiring layers 508 may face the memory stack structure ST with the substrate 102 therebetween.

The peripheral circuit wiring layers 508 and the peripheral circuit contacts 509 may be each formed of a metal, a conductive metal nitride, a metal silicide, or a combination thereof. For example, the peripheral circuit wiring layers 508 and the peripheral circuit contacts 509 may include conductive materials such as W, molybdenum (Mo), Ti, Co, Ta, Ni, W silicide, Ti silicide, Co silicide, Ta silicide, Ni silicide, etc.

Although FIG. 11 shows an example in which the peripheral circuit wiring layers 508 have a three-layer wiring structure in the vertical direction (the Z direction), the inventive concept is not limited thereto. For example, the peripheral circuit wiring layers 508 may have a multilayer wiring structure consisting of two or four or more layers.

In the vertical non-volatile memory device 500, a through hole 102H may be formed in the substrate 102. The through hole 102H may be filled with a substrate buried insulating layer 512. The substrate buried insulating layer 512 may be formed of silicon oxide.

In the vertical non-volatile memory device 500, wiring structures arranged on the connection area CON may be configured to be electrically connected to the peripheral circuit wiring layers 508 arranged on the peripheral circuit area PERI5 through a peripheral contact structure PTS5 extending in the vertical direction (the Z direction).

The peripheral contact structure PTS5 may include a peripheral contact plug P116 extending in the vertical direction (the Z direction) and a peripheral insulating plug P115 surrounding the peripheral contact plug P116. At least some of a plurality of wiring layers ML on the connection area CON and a peripheral wiring layer PML may be configured to be electrically connected to the peripheral circuit wiring layers 508 on the peripheral circuit area PERI5 through the peripheral contact structure PTS5.

The peripheral contact structure PTS5 may extend longitudinally in the vertical direction (the Z direction) from one selected from among the peripheral circuit wiring layers 508 to the peripheral wiring layer PML through the peripheral insulating layer 510 and the substrate buried insulating layer 512. The peripheral contact structure PTS5 may penetrate the substrate 102 through the through hole 102H and may be surrounded by the substrate buried insulating layer 512 within the through hole 102H.

FIGS. 12A through 12E are cross-sectional views for explaining a method of manufacturing a vertical non-volatile memory device, according to an embodiment of the inventive concept.

In detail, FIGS. 12A through 12E illustrate a method of manufacturing the vertical non-volatile memory device 100 of FIGS. 4, 5A and 5B, and 6.

Figure 12A:
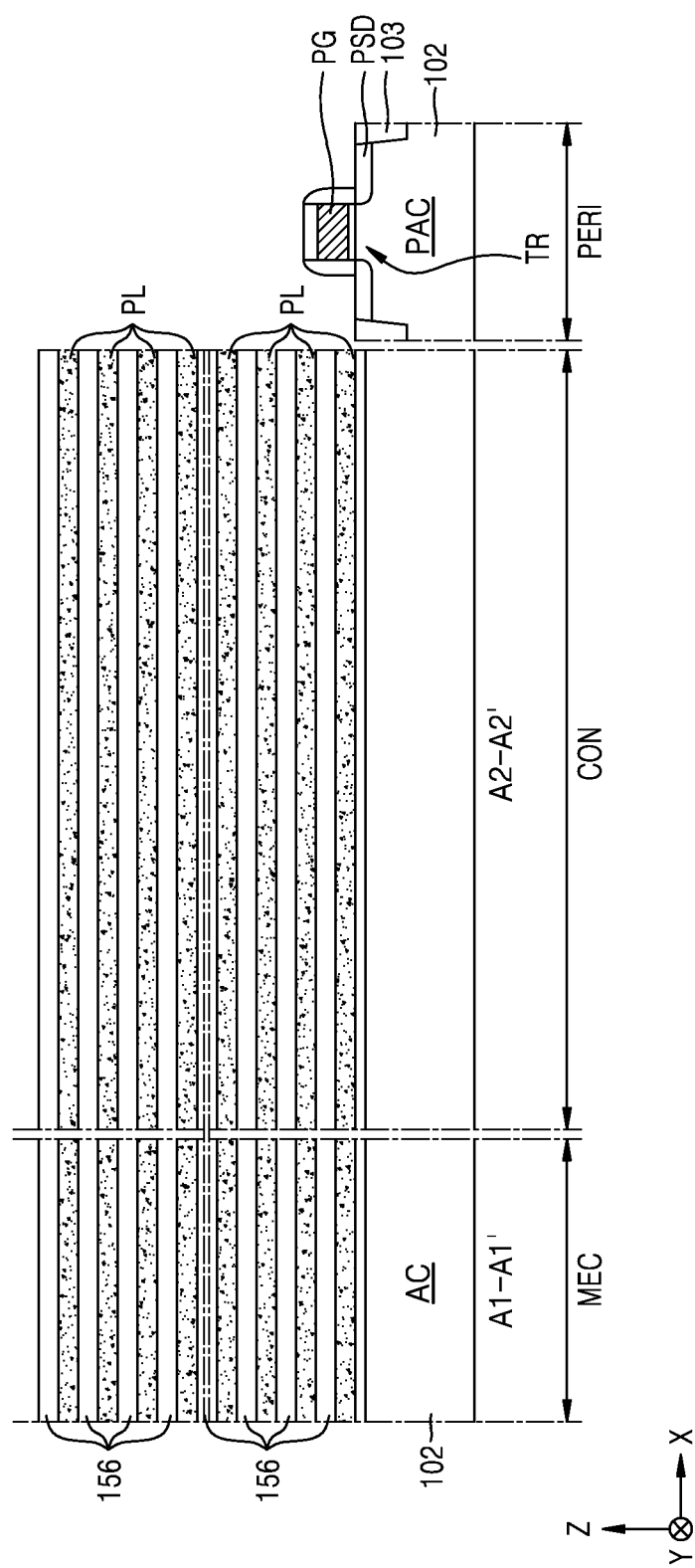
FIGS. 12A through 12E are cross-sectional views for explaining a method of manufacturing a vertical non-volatile memory device, according to an embodiment of the inventive concept.

Referring to FIG. 12A, the active region AC is defined in the memory cell area MEC of the substrate 102, and the peripheral active region PAC is defined in the peripheral circuit area PERI. The peripheral active region PAC may be defined by the device isolation layer 103.

The interlayer insulating layers 156 and a plurality of the sacrificial layers PL are alternately stacked on the memory cell area MEC and the connection area CON, and the peripheral transistor TR is formed on the peripheral circuit area PERI. The sacrificial layers PL may be made of silicon nitride, silicon carbide, or polysilicon. The sacrificial layers PL may be used to secure a space for forming gate lines (GL of FIG. 12C) in a subsequent process, respectively.

Figure 12B:
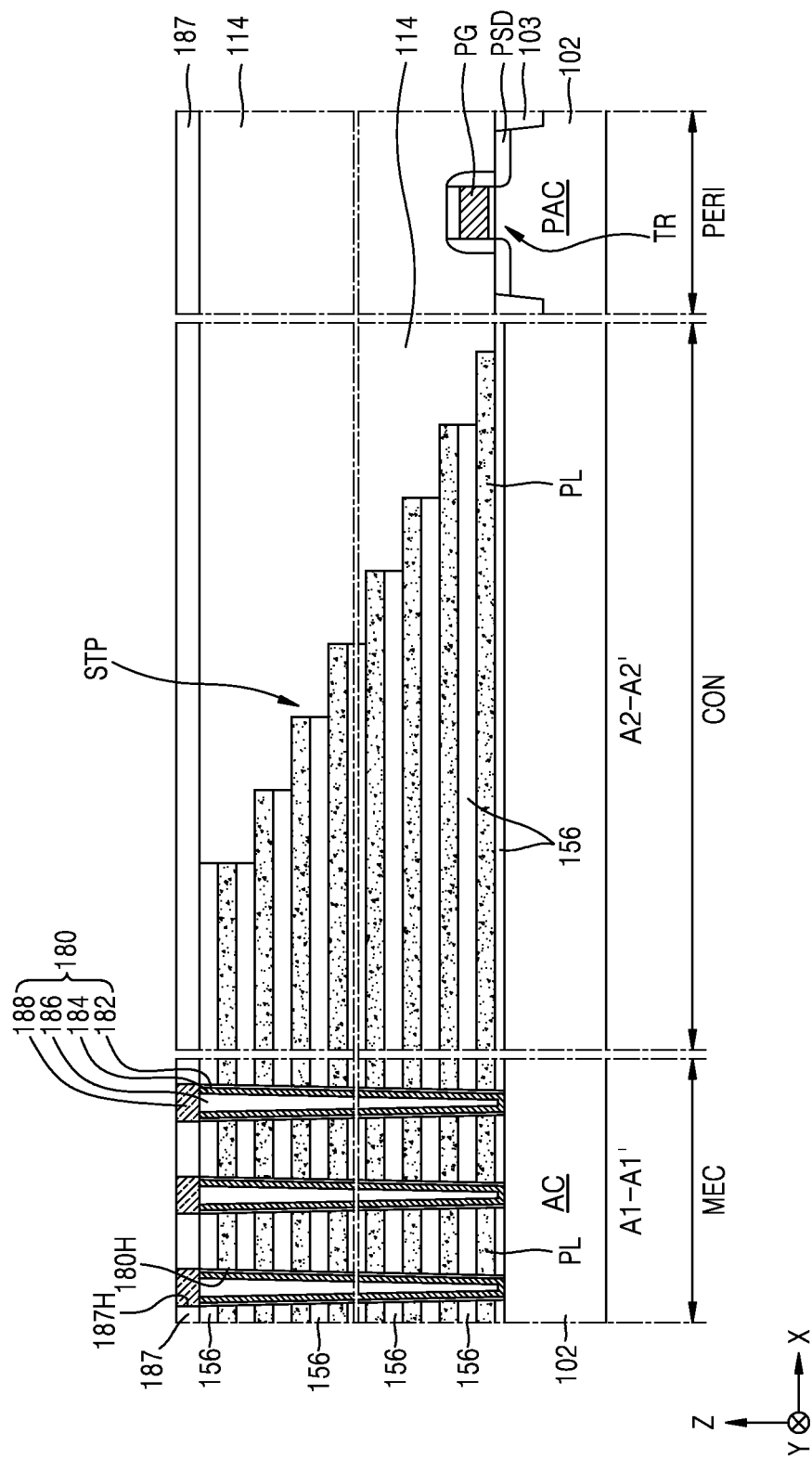

Referring to FIG. 12B, portions of the interlayer insulating layers 156 and the sacrificial layers PL are removed to form a stepped structure STP, and then the cover insulating layer 114 is formed on the substrate 102 to cover the stepped structure STP and the peripheral transistor TR.

Thereafter, in the memory cell area MEC, the channel holes 180H are formed to penetrate the interlayer insulating layers 156 and the sacrificial layers PL and extend in the vertical direction (the Z direction), and the information storage structure 182, the channel layer 184, and the buried insulating layer 186 are formed within each of the channel holes 180H to form a plurality of channel hole buried structures. Here, the information storage structure 182 formed in each of the channel holes 180H may include only a second blocking insulating layer BD2 excluding the first blocking insulating layer BD1 shown in FIG. 6.

Subsequently, the intermediate insulating layer 187 is formed in the memory cell area MEC, the connection area CON, and the peripheral circuit area PERI to cover the channel hole buried structures, the stepped structure STP, and the cover insulating layer 114. A plurality of contact holes 187H are formed in the intermediate insulating layer 187 to expose top surfaces of the channel hole buried structures, and a plurality of drain regions 188 are formed in the contact holes 187H to form channel structures 180. The intermediate insulating layer 187 may be formed to have a planarized top surface across the memory cell area MEC, the connection area CON, and the peripheral circuit area PERI.

Figure 12C:
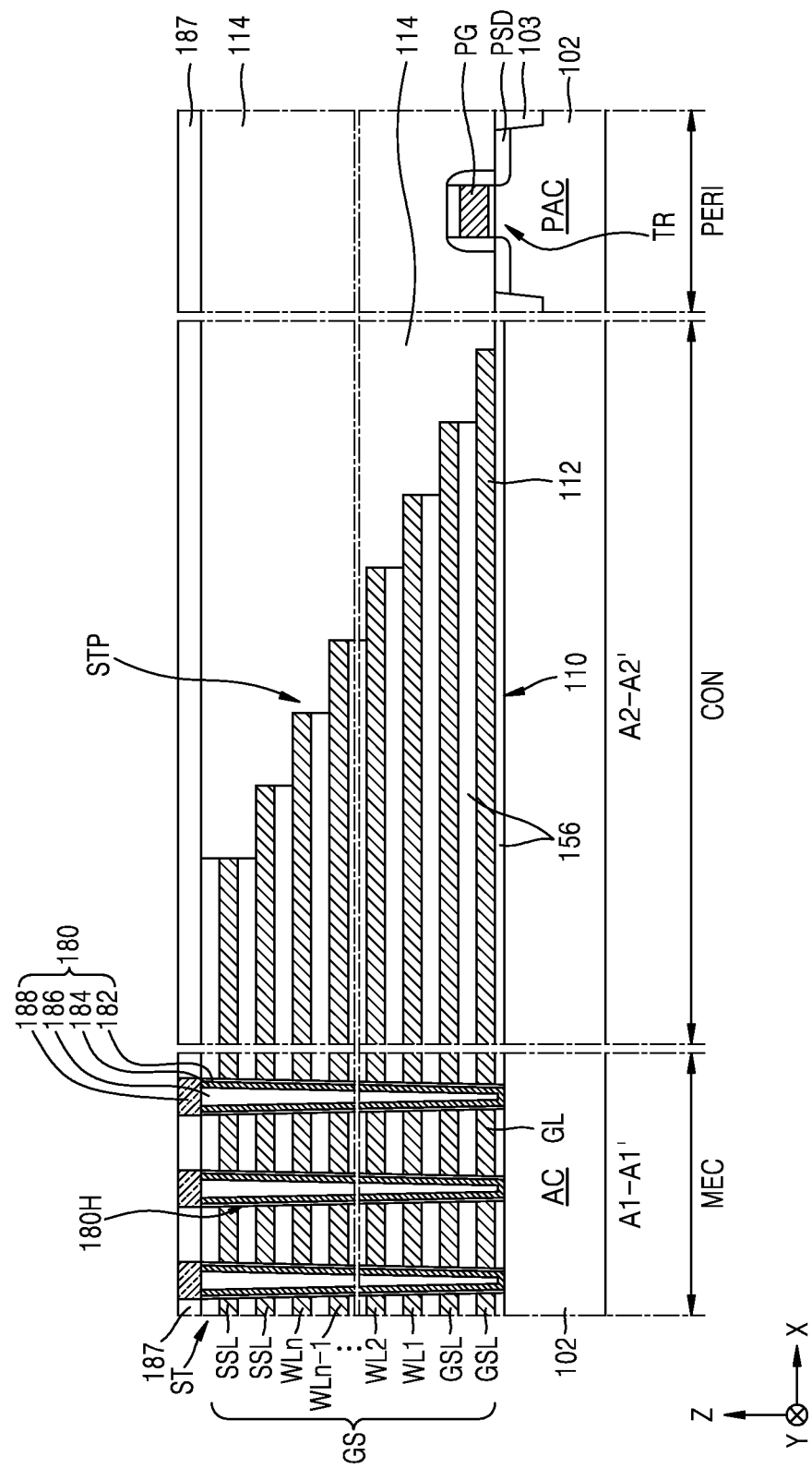

Referring to FIG. 12C, the word line cut regions (WLC of FIGS. 4 and 5B) are formed to penetrate the interlayer insulating layers 156 and the sacrificial layers (PL of FIG. 12B) and expose the substrate 102. Impurity ions are injected into the substrate 102 through the word line cut regions WLC to form the common source regions (106 of FIG. 5B).

Next, the sacrificial layers (PL of FIG. 12B) exposed through the word line cut regions WLC are selectively removed to create an empty space between each of the interlayer insulating layers 156, and then the first blocking insulating layer BD1 is formed on an inner wall of the empty space as shown in FIG. 6. The first blocking insulating layer BD1 is in contact with the second blocking insulating layer BD2 to form the composite blocking insulating layer CBD.

Subsequently, a conductive material is buried in the empty space where the first blocking insulating layer BD1 is formed to thereby form the gate lines GL and the conductive pad regions 112. Accordingly, the sacrificial layers PL are replaced (or substituted) with the gate lines GL and the conductive pad regions 112. In the connection area CON, the conductive pad regions 112 may constitute the stepped connection part 110.

Thereafter, as illustrated in FIG. 5B, the insulating spacer 192 and the common source line CSL are formed inside each of the word line cut regions WLC to form the word line cut structure WCS.

Figure 12D:
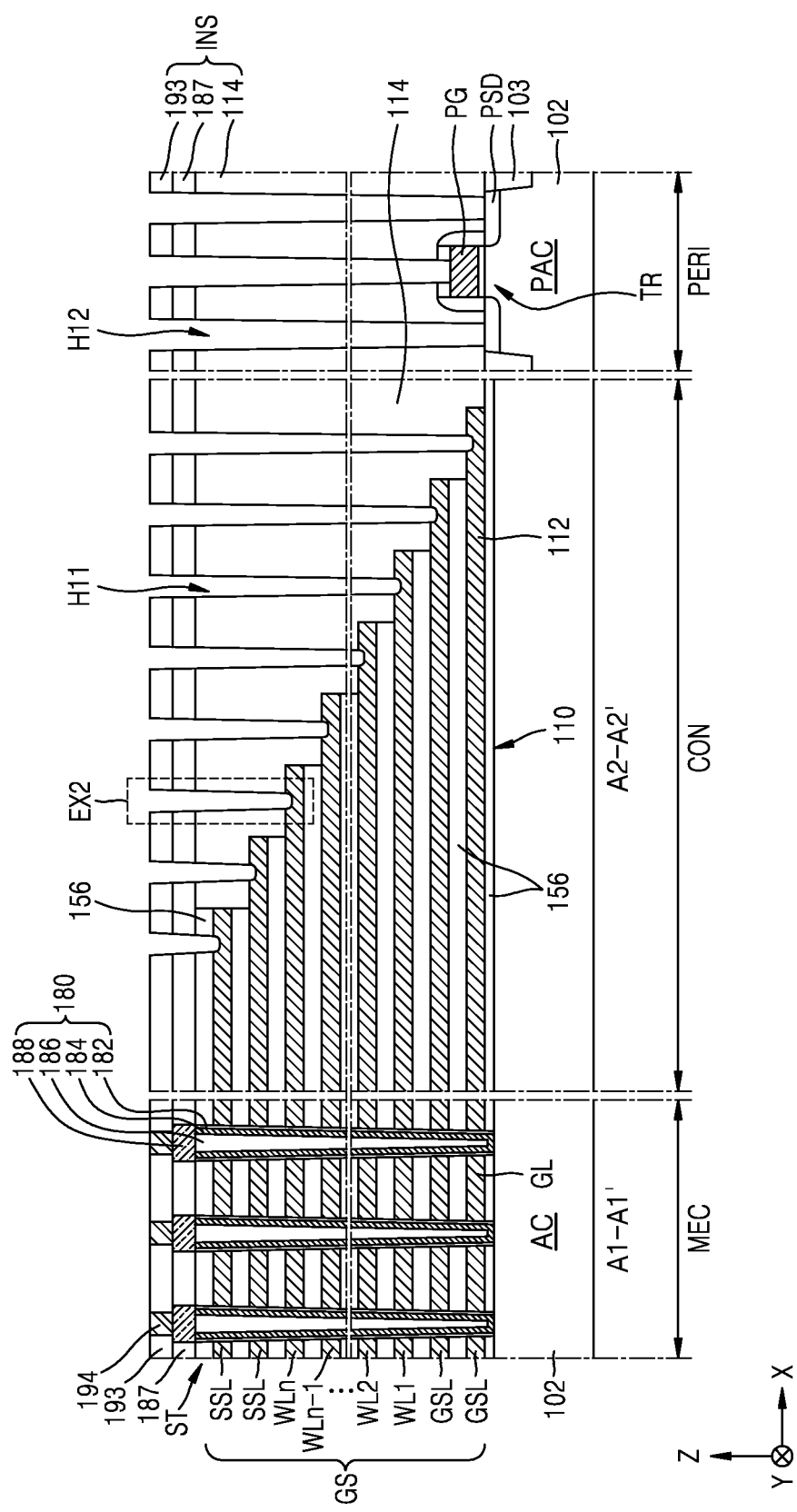

Referring to FIG. 12D, after forming the first upper insulating layer 193 on the resultant structure of FIG. 12C, the bit line contact pads 194 are formed in the memory cell area MEC to penetrate the first upper insulating layer 193 and to be connected to the channel structures 180. The cover insulating layer 114, the intermediate insulating layer 187, and the first upper insulating layer 193 may constitute the insulating structure INS.

Anisotropic etching is performed on the insulating structure INS in the connection area CON and the peripheral circuit area PERI by using a mask pattern (not shown) as an etch mask to form a plurality of first contact holes H11 exposing the conductive pad regions 112 on the connection area CON and a plurality of second contact holes H12 exposing the peripheral gate PG and the peripheral source/drain regions PSD on the peripheral circuit area PERI. The first contact holes H11 may be formed simultaneously with the second contact holes H12.

Figure 12E:
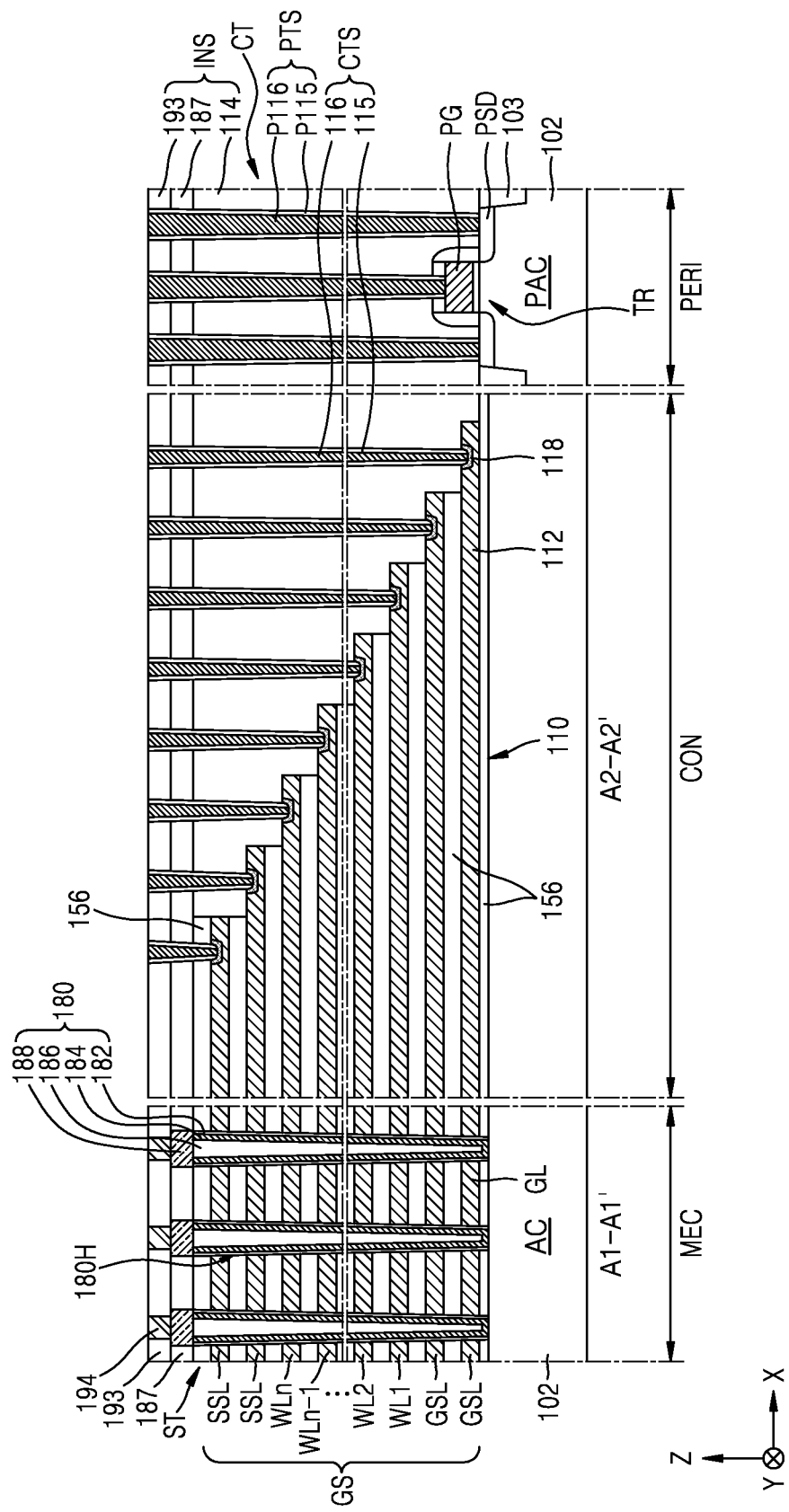

Referring to FIG. 12E, in the connection area CON, the metal silicide layer 118 is formed on a surface of a conductive pad region 112 exposed through each of the first contact holes H11, and a contact structure CTS is formed on the metal silicide layer 118 in each of the first contact holes H11. In addition, in the peripheral circuit area PERI, the peripheral insulating plug P115 and the peripheral contact plug P116 are sequentially formed in each of the second contact hole H12 to form a peripheral contact structure PTS.

Figure 13:
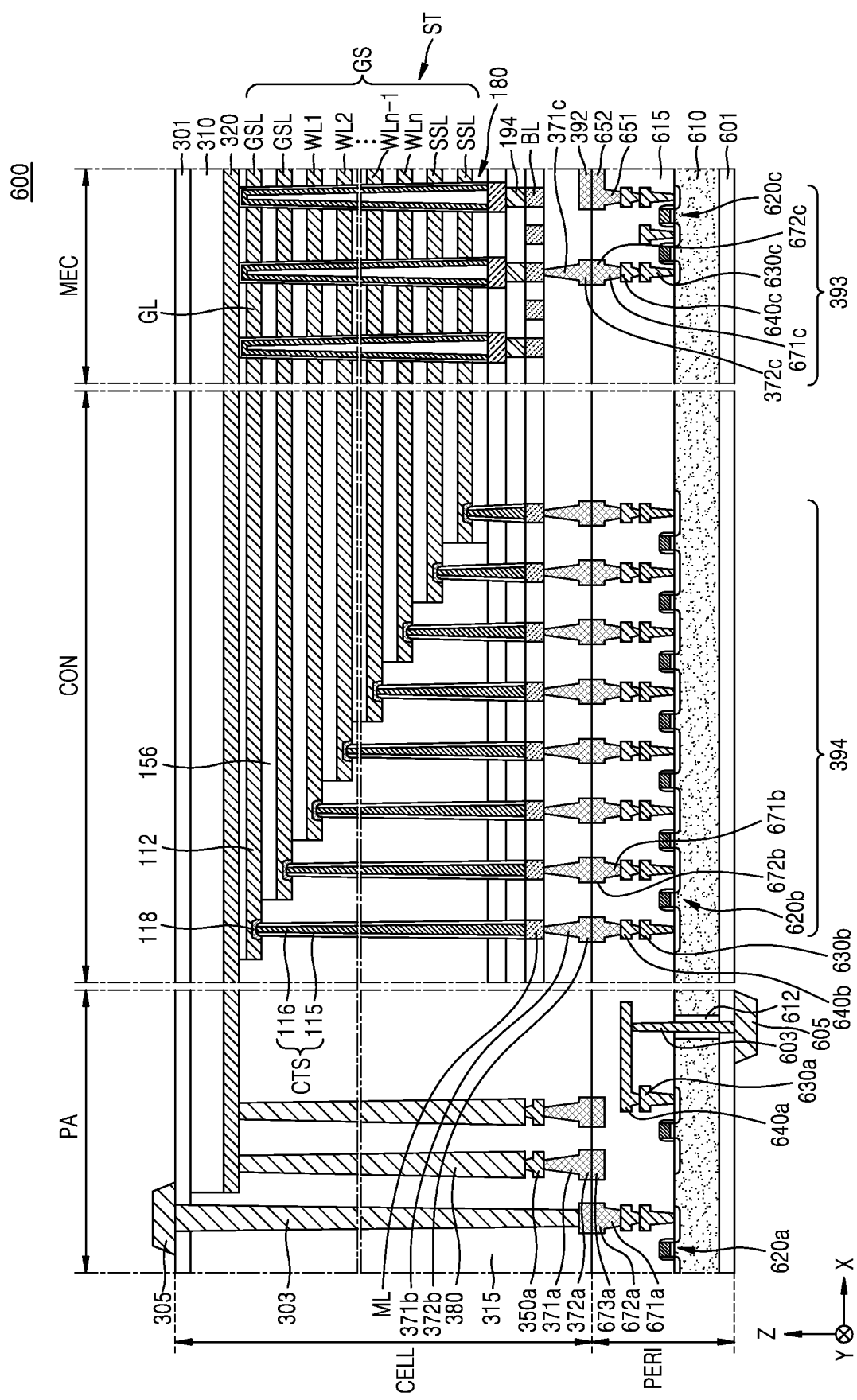
FIG. 13 is a cross-sectional view for explaining a vertical non-volatile memory device according to an embodiment of the inventive concept.

FIG. 13 is a cross-sectional view for explaining a vertical non-volatile memory device 600 according to an embodiment of the inventive concept. In FIG. 13, the same reference numerals as those in FIGS. 4, 5A, 5B, and 6 denote the same elements, and a detailed description thereof is omitted herein.

In detail, the vertical non-volatile memory device 600 may have a chip-to-chip (C2C) structure. The C2C structure may refer to a structure formed by manufacturing an upper chip including a cell area CELL on a first wafer, manufacturing a lower chip including a peripheral circuit area PERI on a second wafer that is different from the first wafer, and then connecting the upper chip to the lower chip by using a bonding method.

For example, the bonding method may include a method of electrically connecting a bonding metal formed on a topmost metal layer of the upper chip including the cell area CELL to a bonding metal formed on an topmost metal layer of the lower chip including the peripheral circuit area PERI. In example embodiments, when the bonding metal is formed of Cu, the bonding method may be a Cu—Cu bonding method. In other example embodiments, the bonding metal may be formed of Al or W.

In the vertical non-volatile memory device 600, the peripheral circuit area PERI and the cell area CELL may each include a pad bonding area PA. The cell area CELL may further include the connection area CON and the memory cell area MEC.

The peripheral circuit area PERI may include a first substrate 610, an interlayer insulating layer 615, a plurality of circuit elements 620a, 620b, and 620c formed on the first substrate 610, first metal layers 630a, 630b, and 630c respectively connected to the circuit elements 620a, 620b, and 620c, and second metal layers 640a, 640b, and 640c respectively formed on the first metal layers 630a, 630b, and 630c.

In an example embodiment, the first metal layers 630a, 630b, and 630c may be formed of W, and the second metal layers 640a, 640b, and 640c may be formed of Cu. In other example embodiments, at least one metal layer may be further formed on the second metal layers 640a, 640b, and 640c. At least some of the at least one metal layer overlying the second metal layers 640a, 640b, and 640c may be formed of Al.

The interlayer insulating layer 615 may cover the circuit elements 620a, 620b, 620c, the first metal layers 630a, 630b, and 630c, and the second metal layers 640a, 640b, and 640c. The interlayer insulating layer 615 may be formed of silicon oxide, silicon nitride, or a combination thereof.

In a region of the peripheral circuit area PERI overlapped by the connection CON, lower bonding metals 671b and 672b may be arranged on the second metal layer 640b. In the connection area CON, the lower bonding metals 671b and 672b in the peripheral circuit area PERI may be electrically connected to upper bonding metals 371b and 372b in the cell area CELL by using a bonding method. The lower bonding metals 671b and 672b and the upper bonding metals 371b and 372b may be each formed of Al, Cu, or W.

The cell area CELL may include a second substrate 310 and a common source line 320. A gate stack GS including a plurality of gate lines GL and a plurality of conductive pad regions 112 connected to the gate lines GL may be arranged on the second substrate 310. Detailed configurations of structures on the connection area CON and the memory cell area MEC of the cell area CELL are the same as or similar to those described with reference to FIGS. 4, 5A, 5B and 6.

In the memory cell area MEC, a channel structure 180 may be connected to the upper bonding metals 371c and 372c through the bit line contact pad 194 and the bit line BL. The bit line BL may be electrically connected to a circuit element included in the peripheral circuit area PERI, e.g., the circuit element 620c providing a page buffer 393, through the upper bonding metals 371c and 372c. The upper bonding metals 371c and 372c may be connected to the lower bonding metals 671c and 672c connected to the circuit element 620c of the page buffer 393.

In the connection area CON, each of the conductive pad regions 112 may extend along a direction parallel to an upper surface of the second substrate 310, and may be connected to the contact structure CTS through the metal silicide layer 118. Each of the contact structures CTS may have one end connected to the metal silicide layer 118 and the other end, opposite to the one end, connected to the upper bonding metals 371b and 372b. The contact structures CTS may be connected to the peripheral circuit area PERI through the upper bonding metals 371b and 372b of the cell area CELL and the lower bonding metals 671b and 672b of the peripheral circuit area PERI.

The contact structures CTS may be electrically connected to the circuit elements 620b providing the row decoder 394 in the peripheral circuit area PERI, respectively. In example embodiments, operating voltages of the circuit elements 620b providing the row decoder 394 may be different from operating voltages of the circuit elements 620c providing the page buffer 393. For example, the operating voltages of the circuit elements 620c providing the page buffer 393 may be greater than the operating voltages of the circuit elements 620b providing the low decoder 394.

A plurality of common source line contact plugs 380 may be arranged in the pad bonding area PA. Each of the common source line contact plugs 380 may be electrically connected to the common source line 320. Each of the common source line contact plugs 380 may be formed of a metal, a metal compound, polysilicon, or a combination thereof. The common source line contact plug 380 may have one end connected to the common source line 320 and the other end, opposite to the one end, connected to a metal layer 350a. The metal layer 350a may be connected to upper metal patterns 371a and 372a. The upper metal patterns 371a and 372a may be each connected to a corresponding one of lower metal patterns 671a, 672a, and 673a in the peripheral circuit area PERI.

A plurality of input/output (I/O) pads, i.e., first and second I/O pads 605 and 305, may be arranged in the pad bonding region PA. A lower insulating layer 601 covering a bottom surface of the first substrate 610 may be formed below the first substrate 610, and the first I/O pad 605 may be formed on the lower insulating layer 601. The first I/O pad 605 may be connected to at least one of the circuit elements 620a, 620b, and 620c arranged in the peripheral circuit area PERI through a first I/O contact plug 603 that penetrates the lower insulating layer 601 and the first substrate 610. An insulating layer 612 may be arranged between the first I/O contact plug 603 and the first substrate 610 to electrically separate the first I/O contact plug 603 from the first substrate 610.

An upper insulating layer 301 covering a top surface of the second substrate 310 may be formed on the second substrate 310. The second I/O pad 305 may be formed on the upper insulating layer 301. The second input/output pad 305 may be connected to at least one of a plurality of circuit elements 620a, 620b, and 620c arranged in the peripheral circuit area PERI through a second I/O contact plug 303.

The second I/O contact plug 303 may be arranged at a position spaced apart from the second substrate 310 and the common source line 320. The second I/O pad 305 may not overlap the conductive pad regions 112 in the vertical direction (the Z direction). The second I/O contact plug 303 may be connected to the second I/O pad 305 through an interlayer insulating layer 315 and the upper insulating layer 301. In example embodiments, one of the first and second I/O pads 605 and 305 may be omitted.

In the pad bonding region PA, the upper metal patterns 371a and 372a formed in a topmost metal layer of the cell area CELL may be connected to a corresponding one of the lower metal patterns 671a, 672a, and 673a formed in a topmost metal layer of the peripheral circuit area PERI. The lower metal pattern 673a formed in the topmost metal layer of the peripheral circuit area PERI may not be connected to a separate contact in the peripheral circuit area PERI. Similarly, in the pad bonding region PA, an upper metal pattern corresponding to and having the same shape as a lower metal pattern formed in a topmost metal layer of the peripheral circuit area PERI may be formed in a topmost metal layer of the cell area CELL.

The lower bonding metals 671b and 672b may be formed on the second metal layer 640b in the connection area CON. The lower bonding metals 671b and 672b may be electrically connected to the upper bonding metals 371b and 372b by using a bonding method. In the memory cell area MEC, an upper metal pattern 392 corresponding to lower metal patterns 651 and 652 formed in a topmost metal layer of the peripheral circuit area PERI may be arranged in a topmost metal layer of the cell area CELL.

Figure 14:
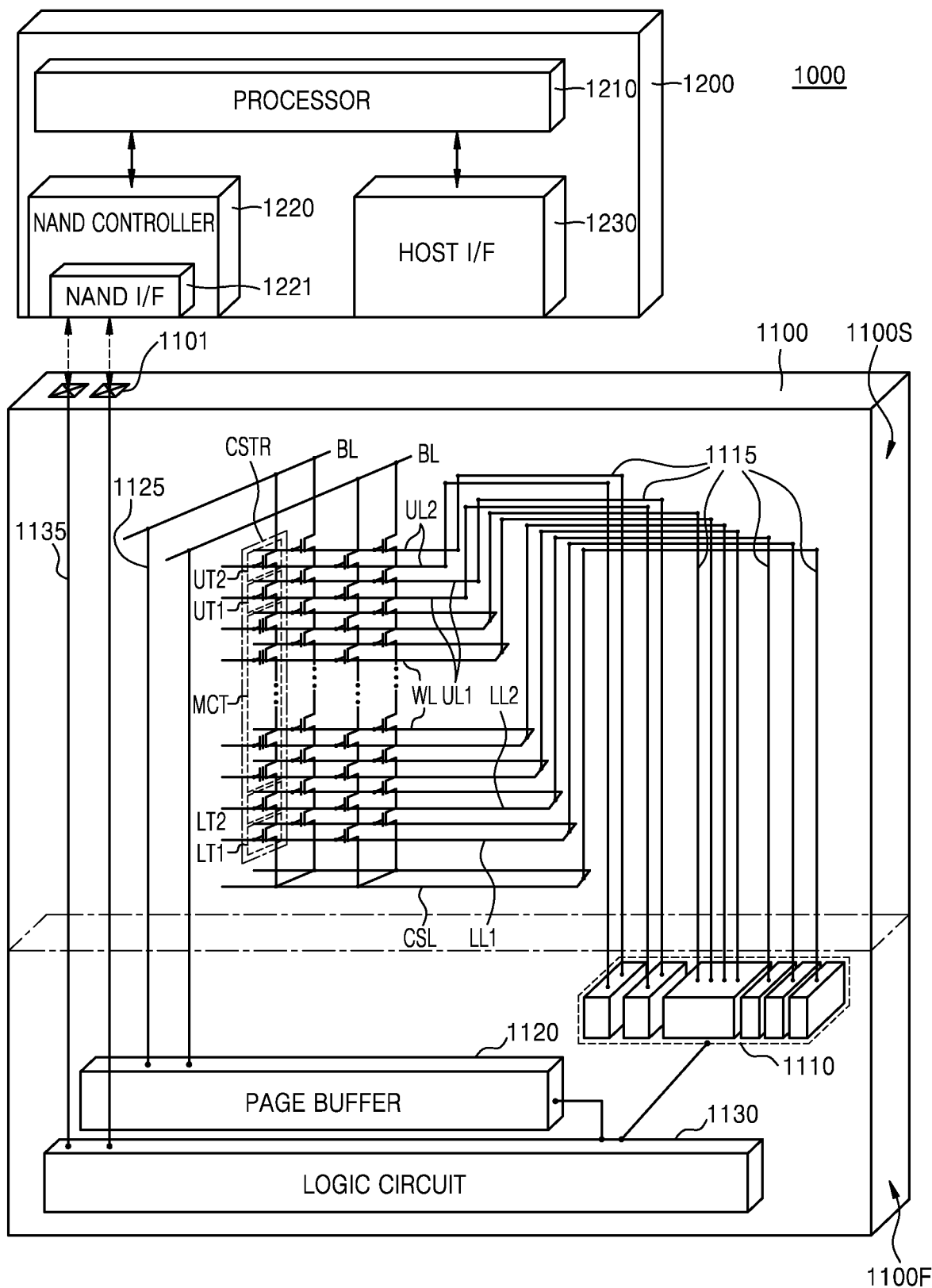
FIG. 14 is a diagram schematically showing an electronic system including a vertical non-volatile memory device, according to an embodiment of the inventive concept.

FIG. 14 is a diagram schematically showing an electronic system 1000 including a vertical non-volatile memory device, according to an embodiment of the inventive concept.

In detail, the electronic system 1000 according to the example embodiment of the inventive concept may include a semiconductor device 1100 and a controller 1200 electrically connected to the semiconductor device 1100. The electronic system 1000 may be a storage device including one or a plurality of semiconductor devices 1100 or an electronic device including the storage device. For example, the electronic system 1000 may be a solid state drive (SSD) device, a universal serial bus (USB), a computing system, a medical device, or a communication device including at least one semiconductor device 1100.

The semiconductor device 1100 may be a non-volatile memory device. For example, the semiconductor device 1100 may be a NAND flash memory device that is a vertical non-volatile memory device as described above. The semiconductor device 1100 may include a first structure 1100F and a second structure 1100S on the first structure 1100F. In the example embodiments, the first structure 1100F may be located next to the second structure 1100S. The first structure 1100F may be a peripheral circuit structure including a decoder circuit 1110, a page buffer 1120, and a logic circuit 1130. The second structure 1100S may be a memory cell structure including a plurality of bit lines BL, a common source line CSL, a plurality of word lines WL, first and second upper gate lines UL1 and UL2, first and second lower gate lines LL1 and LL2, and a plurality of memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may be variously modified according to embodiments.

In example embodiments, the upper transistors UT1 and UT2 may include a string selection transistor, and the lower transistors LT1 and LT2 may include a grounding selection transistor. The first and second lower gate lines LL1 and LL2 may be respectively gate electrodes of the lower transistors LT1 and LT2. A word line WL may be a gate electrode of a memory cell transistor MCT, and the first and second upper gate lines UL1 and UL2 may be gate electrodes of the upper transistors UT1 and UT2.

The common source line CSL, the first and second lower gate lines LL1 and LL2, the word lines WL, and the first and second upper gate lines UL1 and UL2 may be electrically connected to a decoder circuit 1110 via a plurality of first connection wires 1115 extending from within the first structure 1100F to the second structure 1100S. The bit lines BL may be electrically connected to the page buffer 1120 via a plurality of second connection wires 1125 extending from within the first structure 1100F to the second structure 1100S.

In the first structure 1100F, the decoder circuit 1110 and the page buffer 1120 may perform a control operation for at least one of the memory cell transistors MCTs. The decoder circuit 1110 and the page buffer 1120 may be controlled by the logic circuit 1130.

The semiconductor device 1100 may communicate with the controller 1200 through I/O pads 1101 electrically connected to the logic circuit 1130. The I/O pads 1101 may be electrically connected to the logic circuit 1130 through I/O connection wires 1135 extending from the first structure 1100F to the second structure 1100S.

The controller 1200 may include a processor 1210, a NAND controller 1220, and a host interface 1230. According to embodiments, the electronic system 1000 may include a plurality of semiconductor devices 1100, and in this case, the controller 1200 may control the semiconductor devices 1100.

The processor 1210 may control all operations of the electronic system 1000 including the controller 1200. The processor 1210 may operate by executing firmware, and control the NAND controller 1220 to access the semiconductor device 1100. The NAND controller 1220 may include a NAND interface 1221 for processing communication with the semiconductor device 1100. Control commands for controlling the semiconductor device 1100, data to be written to a plurality of memory cell transistors MCT of the semiconductor device 1100, data to be read from the memory cell transistors MCT thereof may be transmitted to the semiconductor device 1100 via the NAND interface 1221. The host interface 1230 may provide a function of communication between the electronic system 1000 and an external host. When a control command is received from the external host via the host interface 1230, the processor 1210 may control the semiconductor device 1100 in response to the control command.

Figure 15:
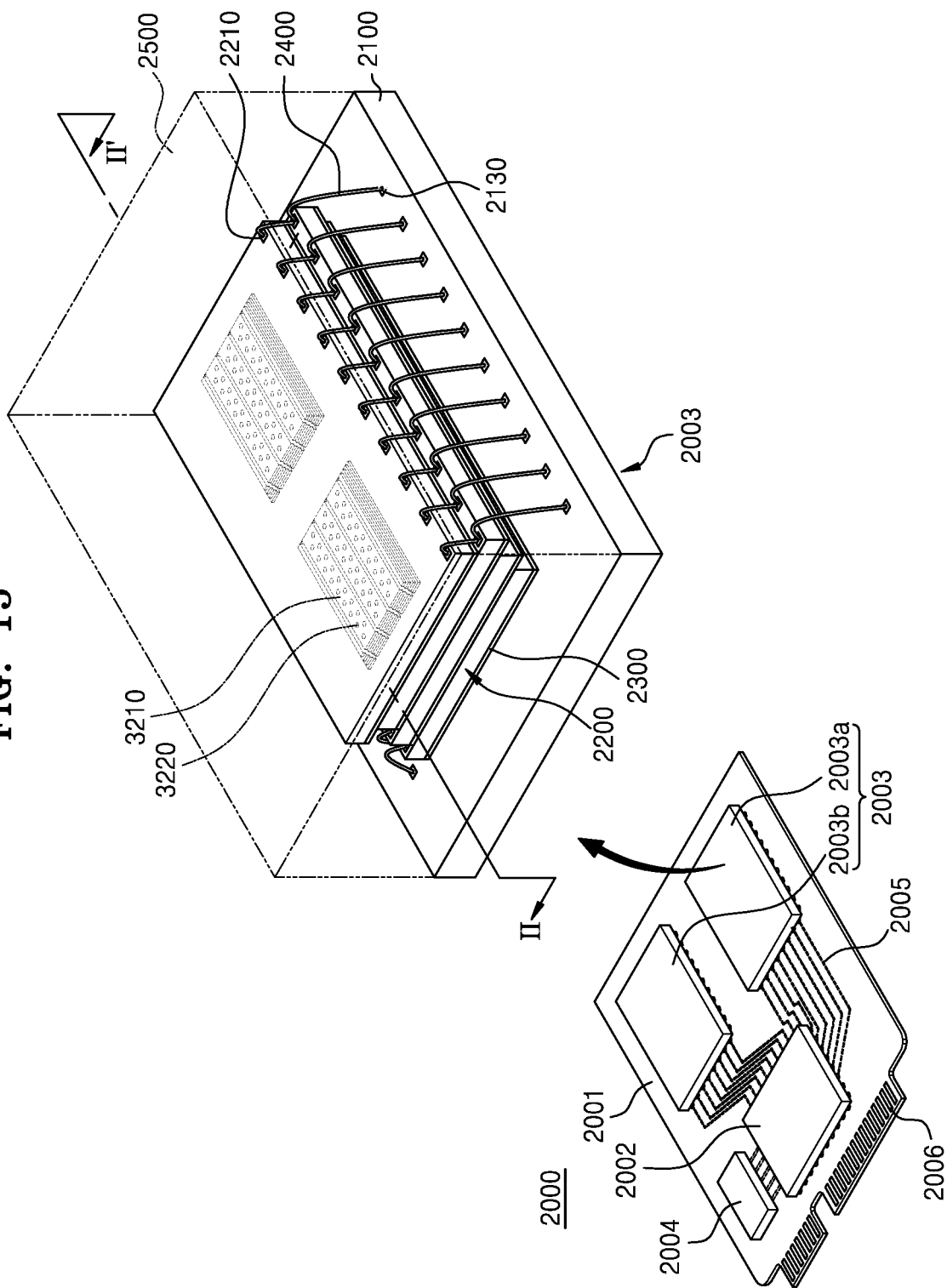
FIG. 15 is a perspective view schematically showing an electronic system including a vertical non-volatile memory device, according to an embodiment of the inventive concept.

FIG. 15 is a perspective view schematically showing an electronic system 2000 including a vertical non-volatile memory device, according to an embodiment of the inventive concept.

In detail, an electronic system 2000 according to the example embodiment of the inventive concept may include a main substrate 2001, a controller 2002 mounted on the main substrate 2001, one or more semiconductor packages 2003, and dynamic random access memory (DRAM) 2004. The semiconductor package 2003 and the DRAM 2004 may be interconnected to the controller 2002 by a plurality of wiring patterns 2005 formed on the main substrate 2001.

The main substrate 2001 may include a connector 2006 including a plurality of pins coupled to an external host. The number and arrangement of pins in the connector 2006 may vary depending on a type of a communication interface between the electronic system 2000 and the external host. In example embodiments, the electronic system 2000 may communicate with the external host using one of interfaces such as USB, Peripheral Component Interconnect Express (PCI-Express), Serial Advanced Technology Attachment (SATA), M-PHY for Universal Flash Storage (UFS), etc. In example embodiments, the electronic system 2000 may operate using power supplied from the external host via the connector 2006. The electronic system 2000 may further include a power management integrated circuit (PMIC) that distributes the power supplied from the external host to the controller 2002 and the semiconductor package 2003.

The controller 2002 may write or read data to or from the semiconductor package 2003, and improve an operating speed of the electronic system 2000.

The DRAM 2004 may be a buffer memory for reducing a speed difference between the external host and the semiconductor package 2003 that is a data storage space. The DRAM 2004 included in the electronic system 2000 may also operate as a type of a cache memory, and provide a space for temporarily storing data during a control operation on the semiconductor package 2003. When the DRAM 2004 is included in the electronic system 2000, the controller 2002 may further include a DRAM controller for controlling the DRAM 2004 in addition to a NAND controller for controlling the semiconductor package 2003.

The semiconductor package 2003 may include first and second semiconductor packages 2003a and 2003b separated from each other. Each of the first and second semiconductor packages 2003a and 2003b may be a semiconductor package including a plurality of semiconductor chips 2200. Each of the first and second semiconductor packages 2003a and 2003b may include a package substrate 2100, a plurality of semiconductor chips 2200 on the package substrate 2100, adhesive layers 2300 respectively arranged on lower surfaces of the semiconductor chips 2200, connection structures 2400 for electrically connecting the semiconductor chips 2200 to the package substrate 2100, and a molding layer 2500 covering the semiconductor chips 2200 and the connection structures 2400 on the package substrate 2100.

The package substrate 2100 may be a printed circuit board (PCB) including a plurality of package upper pads 2130. Each of the semiconductor chips 2200 may include I/O pads 2210. The I/O pads 2210 may correspond to the I/O pads 1101 of FIG. 13. Each of the semiconductor chips 2200 may include a plurality of gate stacks 3210 and a plurality of channel structures 3220. Each of the semiconductor chips 2200 may include a vertical non-volatile memory element 100 described above.

In example embodiments, the connection structures 2400 may be bonding wires for electrically connecting the I/O pads 2210 to the package upper pads 2130. Thus, in each of the first and second semiconductor packages 2003a and 2003b, the semiconductor chips 2200 may be electrically connected to each other through bonding wires and electrically connected to the package upper pads 2130 of the package substrate 2100. According to embodiments, in each of the first and second semiconductor packages 2003a and 2003b, the semiconductor chips 2200 may be electrically connected to each other by a connection structure including a through-silicon via (TSV) instead of the connection structures 2400 using bonding wires.

In example embodiments, the controller 2002 and the semiconductor chips 2200 may be included in a single package. In an example embodiment, the controller 2002 and the semiconductor chips 2200 may be mounted on a separate interposer substrate different from the main substrate 2001, and may be connected to each other through wires formed on the interposer substrate.

Figure 16:
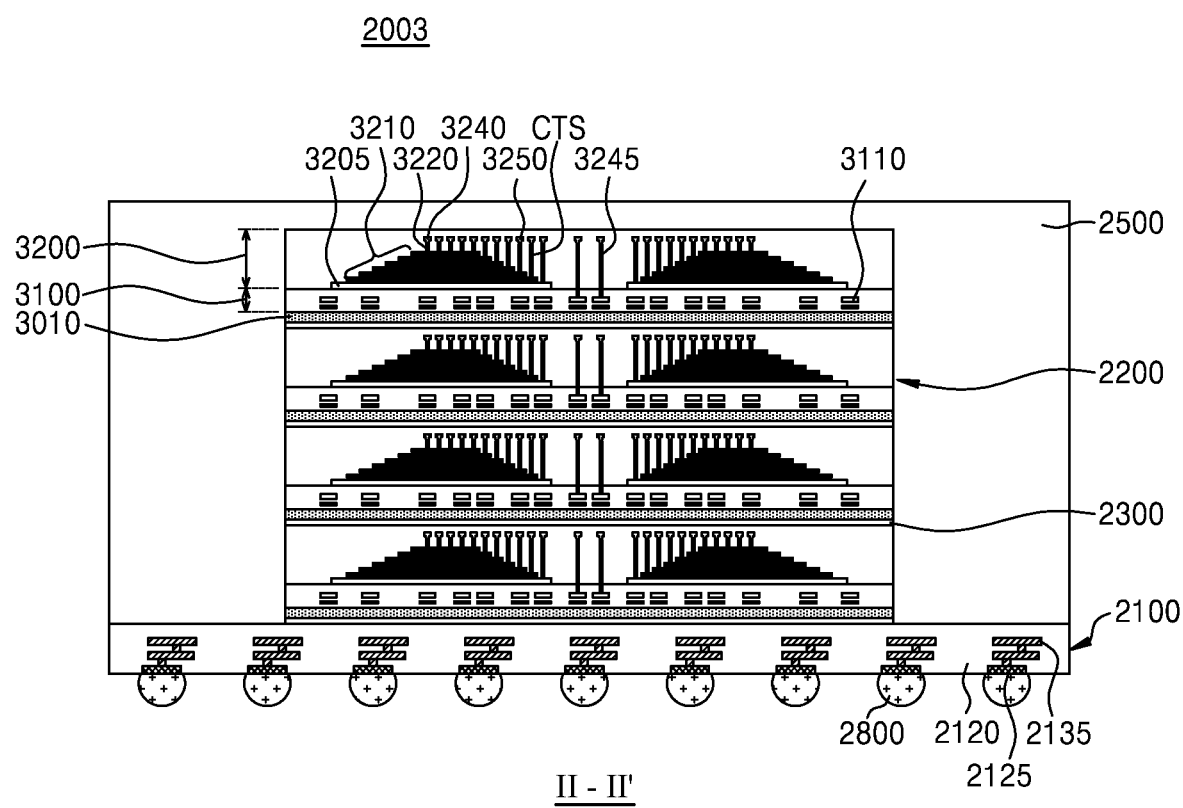
FIG. 16 is a cross-sectional view schematically showing a semiconductor package according to an embodiment of the inventive concept.

FIG. 16 is a cross-sectional view schematically showing the semiconductor package 2003 according to an embodiment of the inventive concept. FIG. 16 shows in more detail a cross-sectional configuration of the semiconductor package 2003 taken along line II-II' of FIG. 15.

In detail, in the semiconductor package 2003, the package substrate 2100 may be a PCB. The package substrate 2100 may include a package substrate body 2120, the package upper pads (2130 of FIG. 15) arranged on an upper surface of the package substrate body 2120, a plurality of lower pads 2125 arranged on a lower surface of the package substrate body 2120 or exposed through the lower surface, and a plurality of inner wires 2135 for electrically connecting the package upper pads 2130 to the lower pads 2125.

The package upper pads 2130 may be electrically connected to the connection structures (2400 of FIG. 15). The lower pads 2125 may be connected to the wiring patterns 2005 on the main substrate 2001 of the electronic system 2000 of FIG. 15 through a plurality of conductive connections 2800.

Each of the semiconductor chips 2200 may include the vertical non-volatile memory element 100 described above. Each of the semiconductor chips 2200 may include a semiconductor substrate 3010 and first and second structures 3100 and 3200 sequentially stacked on the semiconductor substrate 3010. The first structure 3100 may include a peripheral circuit area with a plurality of peripheral wirings 3110. The second structure 3200 may include a common source line 3205, a gate stack 3210 on the common source line 3205, a channel structure 3220 penetrating the gate stack 3210, and a bit line 3240 electrically connected to the channel structure 3220.

Each of the semiconductor chips 2200 may be electrically connected to the peripheral wirings 3110 of the first structure 3100 and include through-wirings 3245 extending into the second structure 3200. The through-wiring 3245 may be arranged on outside of the gate stack 3210.

In other example embodiments, the semiconductor package 2003 may further include a through-wiring passing through the gate stack 3210. Each of the semiconductor chips 2200 may further include the I/O pads (2210 of FIG. 15) electrically connected to the peripheral wirings 3110 of the first structure 3100.

Figure 17:
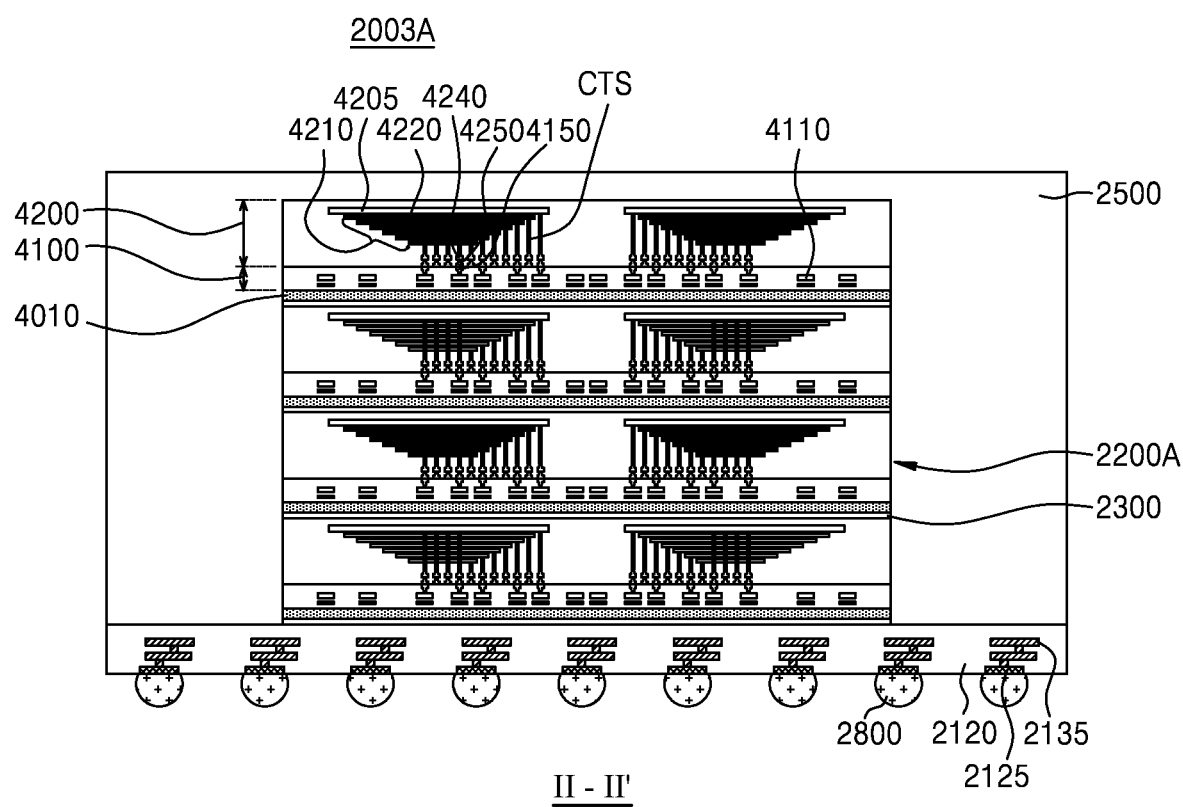
FIG. 17 is a cross-sectional view schematically showing a semiconductor package according to an embodiment of the inventive concept.

FIG. 17 is a cross-sectional view schematically showing a semiconductor package 2003A according to an embodiment of the inventive concept. FIG. 17 shows in more detail a cross-sectional configuration of the semiconductor package 2003 taken along line II-II' of FIG. 15.

In detail, the semiconductor package 2003A has substantially the same configuration as the semiconductor package 2003 described with reference to FIG. 16. However, the semiconductor package 2003A includes a plurality of semiconductor chips 2200A. Each of the semiconductor chips 2200A may include the vertical non-volatile memory device 100 described above.

Each of the semiconductor chips 2200A may include a semiconductor substrate 4010, a first structure 4100 on the semiconductor substrate 4010, and a second structure 4200 bonded to the first structure 4100 using a wafer bonding method.

The first structure 4100 may include a peripheral circuit area including a plurality of peripheral wirings 4110 and a plurality of first bonding structures 4150. The second structure 4200 may include a common source line 4205, a gate stack 4210 between the common source line 4205 and the first structure 4100, and a channel structure 4220 penetrating the gate stack 4210.

In addition, each of the semiconductor chips 2200A may include a plurality of second bonding structures 4250 respectively electrically connected to a plurality of word lines (WL of FIG. 14) of the gate stack 4210. For example, the second bonding structures 4250 may be electrically connected to the channel structure 4220 and the word lines WL through a bit line 4240 electrically connected to the channel structure 4220 and contact structures CTS electrically connected to the word lines WL.

The first bonding structures 4150 of the first structure 4100 may be bonded to the second bonding structures 4250 of the second structure 4200 while contacting the second bonding structures 4250. Portions where the first bonding structures 4150 are bonded to the second bonding structures 4250 may be formed of, for example, Cu.

The semiconductor chips 2200 of FIG. 16 may be electrically connected to the semiconductor chips 2200A of FIG. 17 by the connection structures 2400 that are in the form of bonding wires. In other example embodiments, the semiconductor chips 2200 of FIG. 16 may be electrically connected to the semiconductor chips 2200A of FIG. 17 by a connection structure including a TSV.

While the inventive concept has been particularly shown and described with reference to some example embodiments thereof, it will be understood that various changes in form and details may be made therein without departing from the scope of the following claims.

What is claimed is:

1. A vertical non-volatile memory device comprising:
 a memory stack structure including gate lines and interlayer insulating layers alternately stacked in a stacking direction and including a channel hole that is in the gate lines and the interlayer insulating layers and extends in the stacking direction;

a channel layer in the channel hole of the memory stack structure and extending in the stacking direction; and
an information storage structure including a composite blocking insulating layer, a charge storage layer, and a tunneling insulating layer sequentially arranged in a horizontal direction from the gate lines to the channel layer,
wherein the composite blocking insulating layer includes a first metal oxide having a higher dielectric constant than silicon oxide,
wherein the composite blocking insulating layer comprises a plurality of blocking insulating layers arranged in a descending order of oxidation density in the horizontal direction from the gate lines to the channel layer,
wherein a first one of the plurality of blocking insulating layers comprises portions extending on first, second, third, and fourth surfaces of the gate lines, respectively,
wherein the gate lines each comprise a single metal layer, and
wherein the first one of the plurality of blocking insulating layers comprises an insulator that directly contacts the first, second, third, and fourth surfaces of the gate lines.

2. The vertical non-volatile memory device of claim 1, wherein a second one of the plurality of blocking insulating layers extends between the portions of the first one of the plurality of blocking insulating layers and the channel layer.

3. The vertical non-volatile memory device of claim 1, wherein one of the plurality of blocking insulating layers includes a continuous layer extending in the channel hole in the stacking direction.

4. The vertical non-volatile memory device of claim 1, wherein the composite blocking insulating layer includes a second metal oxide having a higher oxidation density than silicon oxide.

5. The vertical non-volatile memory device of claim 4, wherein the second metal oxide is one of aluminum oxide, titanium oxide, tantalum oxide, magnesium oxide, hafnium oxide, zirconium oxide, and scandium oxide.

6. The vertical non-volatile memory device of claim 1, wherein the composite blocking insulating layer includes a second metal oxide having a lower oxidation density than silicon oxide.

7. The vertical non-volatile memory device of claim 6, wherein the second metal oxide is one of germanium oxide, ruthenium oxide, yttrium oxide, lanthanum oxide, and strontium oxide.

8. A vertical non-volatile memory device comprising:
a memory stack structure including gate lines and interlayer insulating layers alternately stacked in a stacking direction and including a channel hole in the gate lines and the interlayer insulating layers;
a channel layer in the channel hole of the memory stack structure and extending in the stacking direction; and
an information storage structure including a composite blocking insulating layer, a charge storage layer, and a tunneling insulating layer sequentially arranged in a horizontal direction from the gate lines to the channel layer,
wherein the composite blocking insulating layer includes a first metal oxide having a higher dielectric constant than silicon oxide,
wherein the composite blocking insulating layer comprises a first blocking insulating layer and a second blocking insulating layer that is between the first blocking insulating layer and the charge storage layer and has a lower oxidation density than the first blocking insulating layer,
wherein the first blocking insulating layer comprises portions extending on first, second, third, and fourth surfaces of a respective one of the gate lines,
wherein the gate lines each comprise a single metal layer, and
wherein the first blocking insulating layer comprises an insulator that directly contacts the first, second, third, and fourth surfaces of the respective one of the gate lines.

9. The vertical non-volatile memory device of claim 8, wherein the second blocking insulating layer comprises a plurality of sub-blocking insulating layers.

10. The vertical non-volatile memory device of claim 9, wherein the plurality of sub-blocking insulating layers comprise a first sub-blocking insulating layer and a second sub-blocking insulating layer that is between the first sub-blocking insulating layer and the charge storage layer and has a lower oxidation density than the first sub-blocking insulating layer.

11. The vertical non-volatile memory device of claim 8, wherein the composite blocking insulating layer includes a second metal oxide having a higher oxidation density than silicon oxide.

12. The vertical non-volatile memory device of claim 8, wherein the composite blocking insulating layer includes a second metal oxide having a lower oxidation density than silicon oxide.

13. The vertical non-volatile memory device of claim 8, wherein the first blocking insulating layer comprises a plurality of portions, each of which is between a respective one of the gate lines and the second blocking insulating layer, and
the second blocking insulating layer contacts the plurality of portions of the first blocking insulating layer.

14. A memory device comprising:
a memory stack structure including gate lines and interlayer insulating layers alternately stacked in a vertical direction;
a channel layer extending in the vertical direction in the memory stack structure; and
an information storage structure extending between the gate lines and the channel layer and including a composite blocking insulating layer, a charge storage layer, and a tunneling insulating layer sequentially stacked on the gate lines in a horizontal direction,
wherein the composite blocking insulating layer comprises first and second blocking insulating layers,
the first and second blocking insulating layers each comprise a first metal oxide having a higher dielectric constant than silicon oxide,
the first blocking insulating layer comprises portions extending on first, second, third, and fourth surfaces of the gate lines, respectively,
the second blocking insulating layer includes a continuous layer extending between the portions of the first blocking insulating layer and the charge storage layer in the vertical direction,
the second blocking insulating layer has a lower oxidation density than the first blocking insulating layer,
wherein the gate lines each comprise a single metal layer, and
wherein the first blocking insulating layer comprises an insulator that directly contacts the first, second, third, and fourth surfaces of a respective one of gate lines.

15. The memory device of claim 14, wherein the second blocking insulating layer comprises a plurality of sub-blocking insulating layers.

16. The memory device of claim 15, wherein the plurality of sub-blocking insulating layers comprise a first sub-blocking insulating layer, and
 a second sub-blocking insulating layer that is between the first sub-blocking insulating layer and the charge storage layer and has a lower oxidation density than the first sub-blocking insulating layer.

17. The memory device of claim 14, wherein the composite blocking insulating layer includes a second metal oxide having a higher oxidation density than silicon oxide or having a lower oxidation density than the silicon oxide.

18. The memory device of claim 14, wherein the charge storage layer includes a continuous layer extending on a side of the second blocking insulating layer in the vertical direction.

19. The memory device of claim 14, wherein the tunneling insulating layer includes a continuous layer extending on a side of the charge storage layer in the vertical direction.

\* \* \* \* \*